United States Patent [19]

Hirayama et al.

[11] Patent Number: 5,686,980
[45] Date of Patent: Nov. 11, 1997

[54] LIGHT-SHIELDING FILM, USEABLE IN AN LCD, IN WHICH FINE PARTICLES OF A METAL OR SEMI-METAL ARE DISPERSED IN AND THROUGHOUT AN INORGANIC INSULATING FILM

[75] Inventors: Hideo Hirayama, Yokohama; Nobuki Ibaraki, Kanagawa-ken; Koji Hidaka, Yokohama; Kiyotsugu Mizouchi, Yokohama; Michiya Kobayashi, Yokohama; Takashi Ishigami, Yokohama; Ryo Sakai, Yokohama; Makoto Kikuchi, Yokohama, all of Japan

[73] Assignee: Kabushiki Kaisha Toshiba, Kawasaki, Japan

[21] Appl. No.: 479,463

[22] Filed: Jun. 7, 1995

[30] Foreign Application Priority Data

Apr. 3, 1995 [JP] Japan ..................... 7-077451

[51] Int. Cl.⁶ .................. G02F 1/1333; H01L 31/062; H01L 31/113; H01L 31/232
[52] U.S. Cl. .................. 349/110; 349/111; 257/294; 257/435
[58] Field of Search .................. 359/67; 257/294, 257/435, 436, 437; 430/7, 20; 349/110, 111

[56] References Cited

U.S. PATENT DOCUMENTS

| | | | |
|---|---|---|---|
| 4,143,297 | 3/1979 | Fischer | 313/502 |
| 4,153,908 | 5/1979 | Meyer | 257/435 |
| 4,157,215 | 6/1979 | Hanak | 359/888 |
| 4,191,452 | 3/1980 | Grinberg et al. | 359/72 |
| 4,618,592 | 10/1986 | Kuramoto et al. | 501/96 |
| 4,781,766 | 11/1988 | Barnett et al. | 136/258 |
| 4,927,513 | 5/1990 | Schultheiss et al. | 204/192.13 |
| 5,042,917 | 8/1991 | Fujita et al. | 359/72 |
| 5,084,777 | 1/1992 | Slobodin | 359/67 |
| 5,440,411 | 8/1995 | Fujiwara et al. | 359/42 |
| 5,513,040 | 4/1996 | Yang | 359/585 |
| 5,527,649 | 6/1996 | Sato et al. | 430/20 |

FOREIGN PATENT DOCUMENTS

| | | |
|---|---|---|
| 0 546 198 | 6/1993 | European Pat. Off. . |
| 0546198 | 6/1993 | European Pat. Off. . |
| 0614108 | 9/1994 | European Pat. Off. . |
| 2034803 | 2/1990 | Japan . |
| 4-012325 | 1/1992 | Japan ................. 430/20 |
| 6-66471 | 8/1994 | Japan . |

OTHER PUBLICATIONS

Abstract of JP-5249309 dated Sep. 1993, Japan, KOJI.
Anstract of JP-5065631 dated Mar. 1993, Japan, Takashi.

*Primary Examiner*—William L. Sikes
*Assistant Examiner*—Walter J. Malinowski
*Attorney, Agent, or Firm*—Cushman Darby & Cushman IP Group of Pillsbury Madison & Sutro, LLP

[57] ABSTRACT

A light-shielding film, and a liquid crystal display device including the light-shielding film, and a material suitable for forming the light-shielding film. The light-shielding film includes at least a film prepared from an inorganic insulating material and fine particles of metal and/or semi-metal dispersed in the insulating material film. The liquid crystal display device includes a display pixel electrode array substrate, a counter substrate, and a liquid crystal layer interposed between the two substrates. The light-shielding film is formed on the display pixel electrode array substrate of the liquid crystal display device.

55 Claims, 9 Drawing Sheets

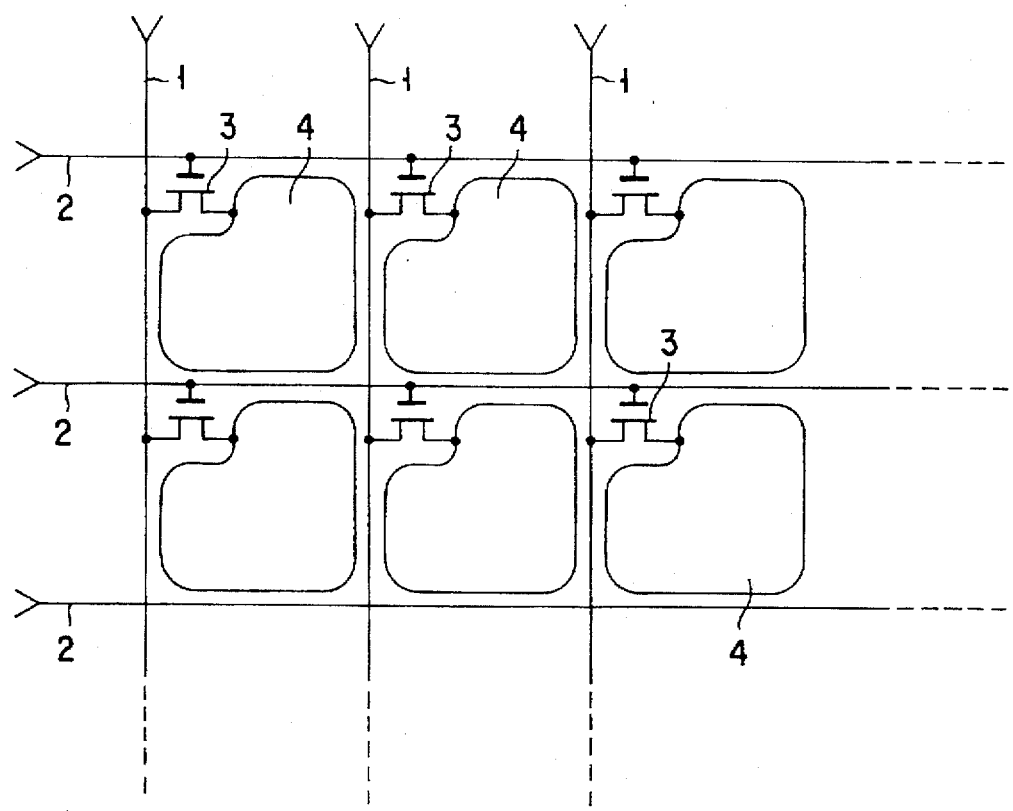
F I G. 4
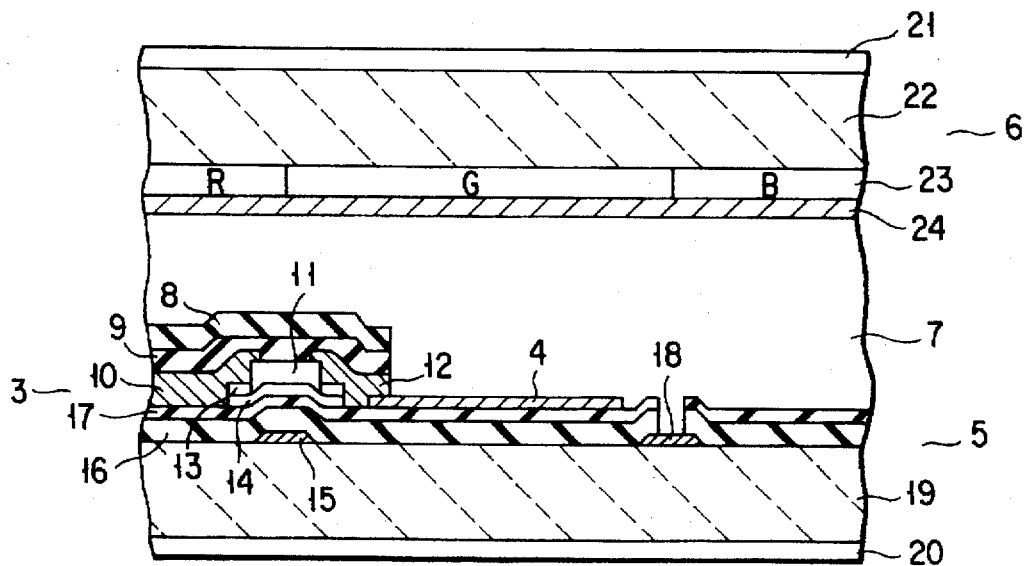
F I G. 5

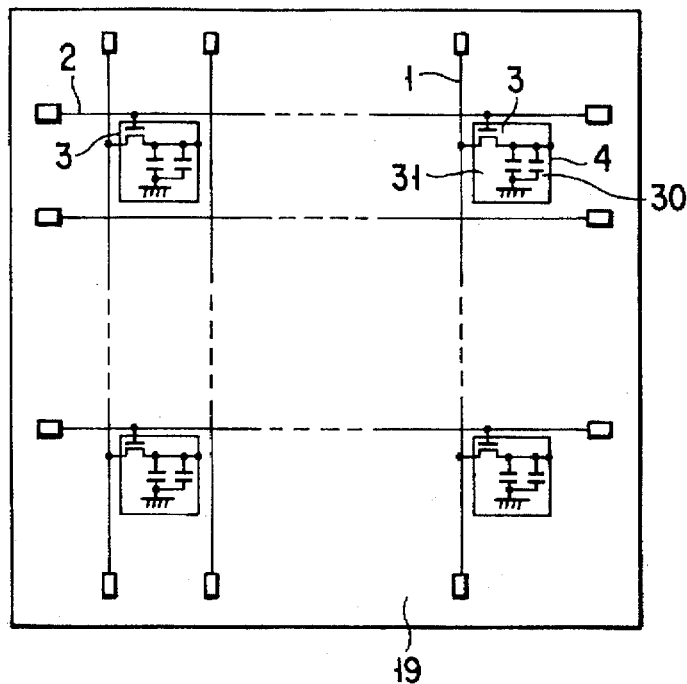
F I G. 9
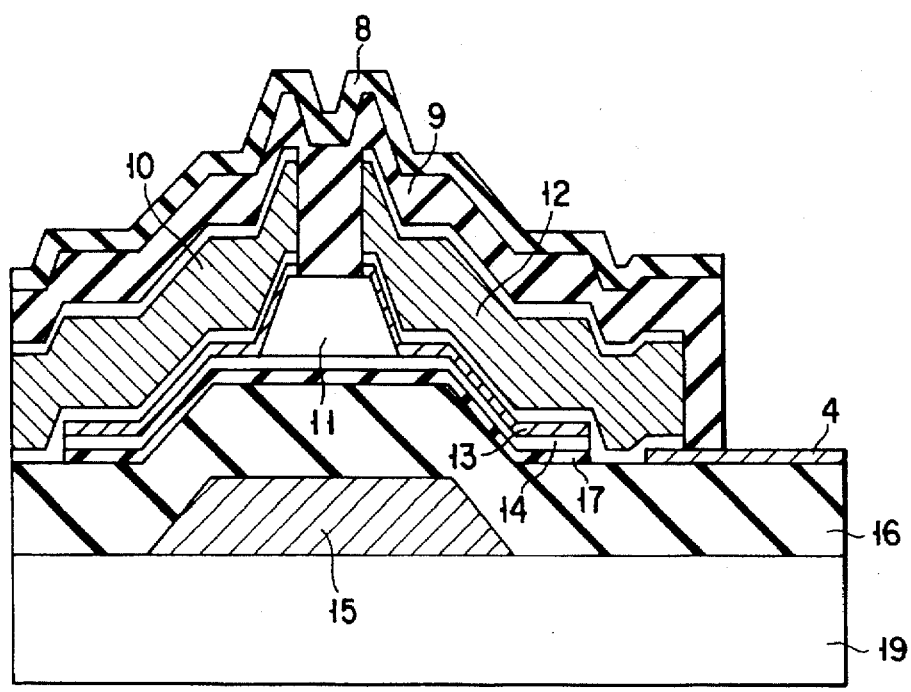
F I G. 10

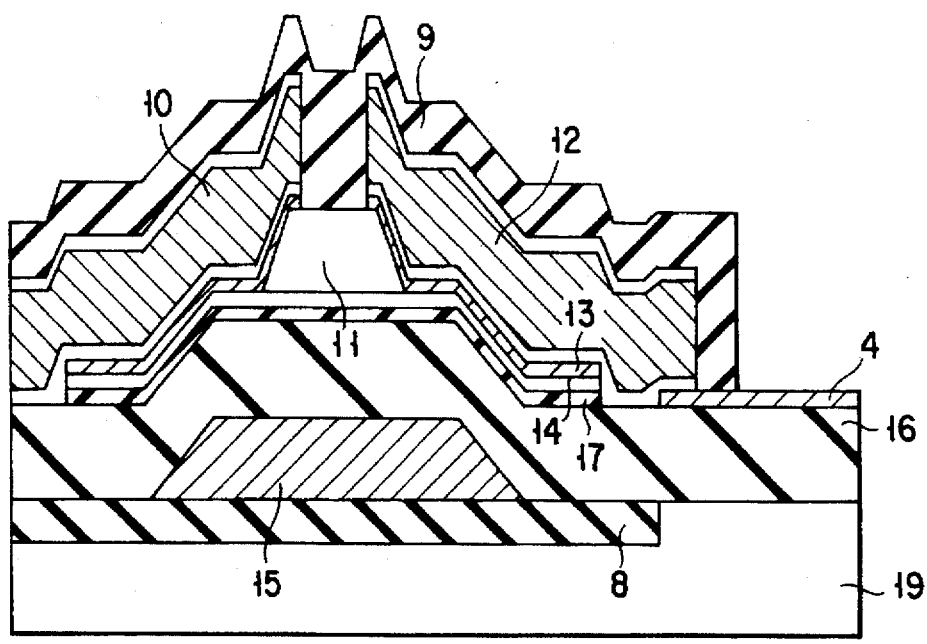
F I G. 11
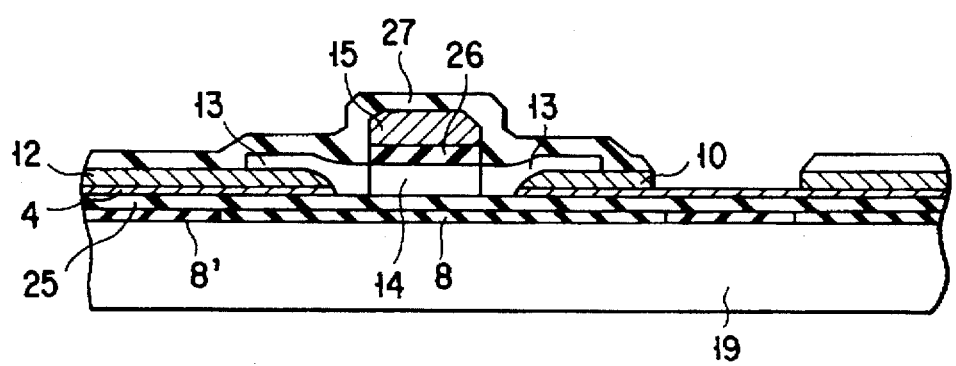
F I G. 12

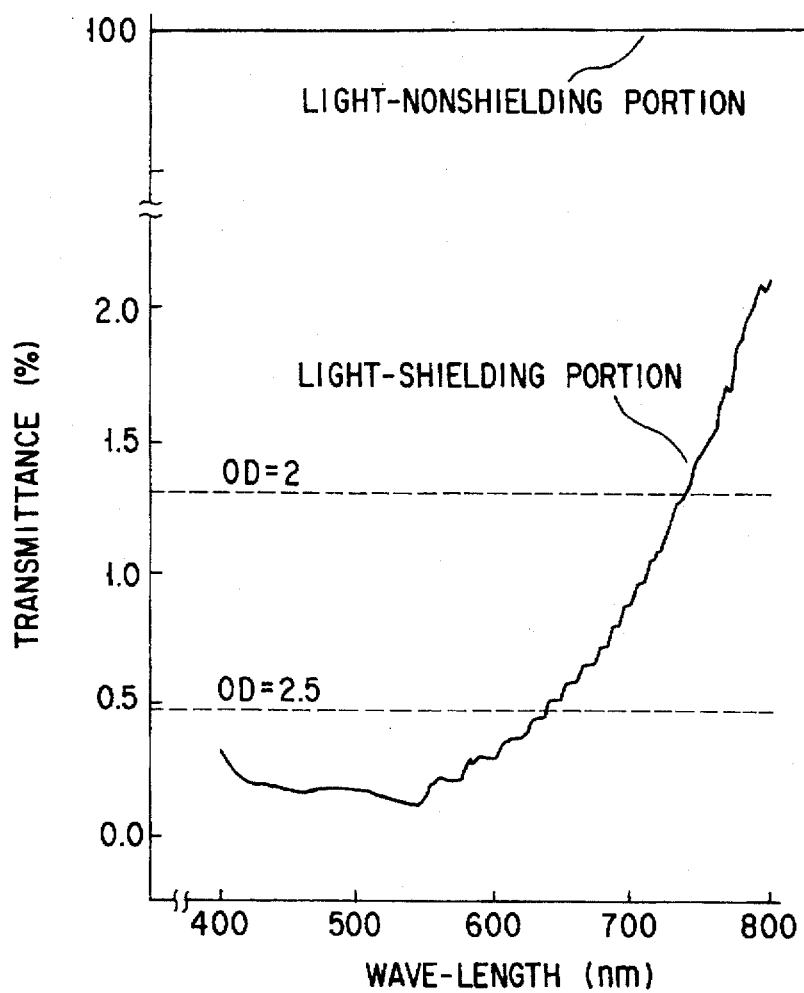
FIG. 13
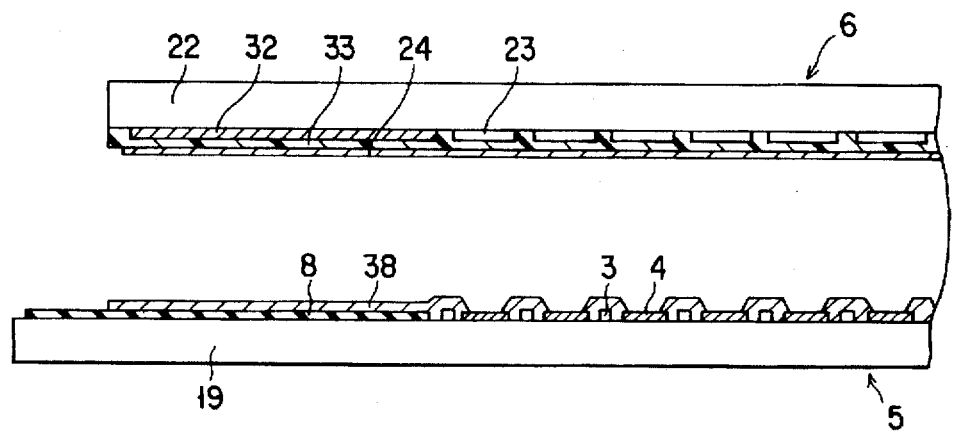
FIG. 14 ← DISPLAY REGION →

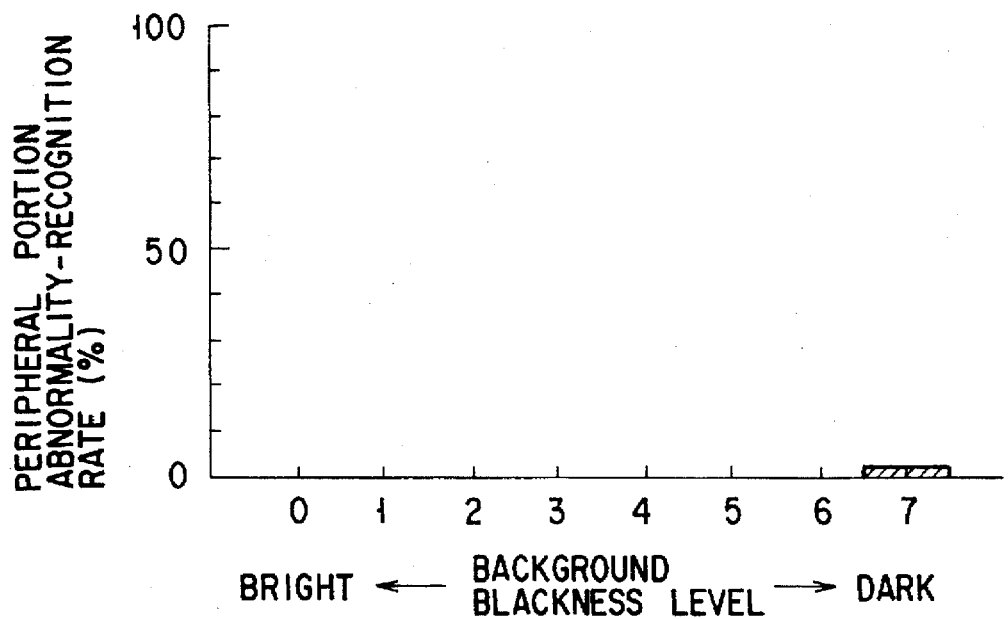
F I G. 15A
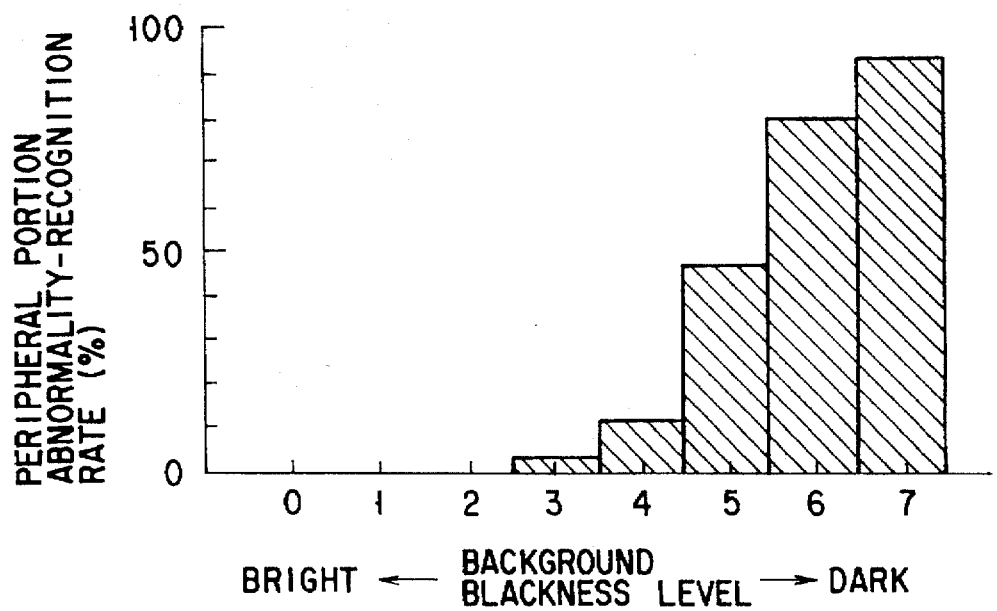
F I G. 15B

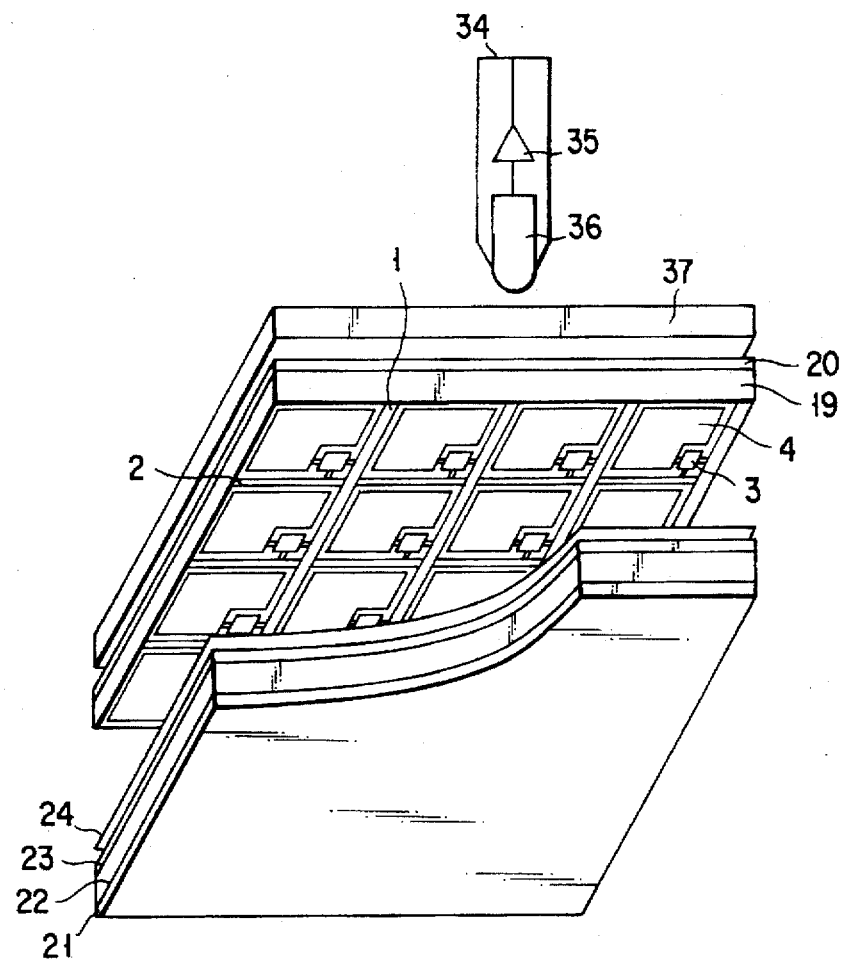
F I G. 16
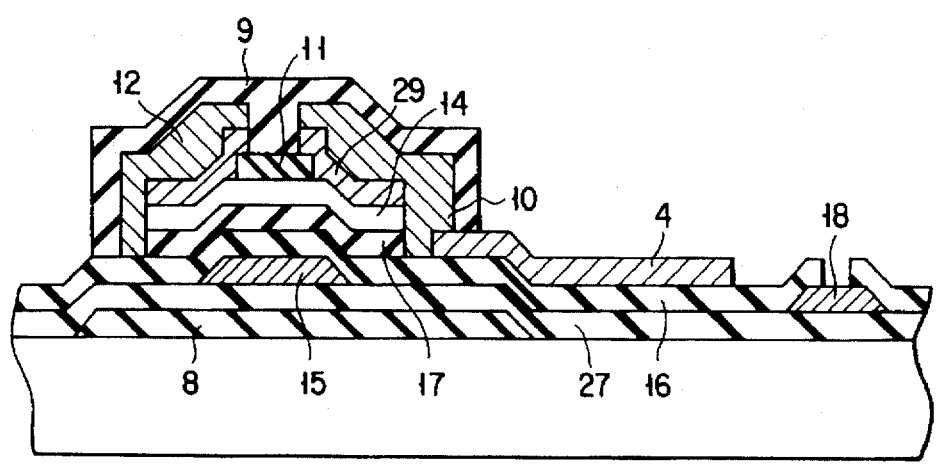
F I G. 17

LIGHT-SHIELDING FILM, USEABLE IN AN LCD, IN WHICH FINE PARTICLES OF A METAL OR SEMI-METAL ARE DISPERSED IN AND THROUGHOUT AN INORGANIC INSULATING FILM

BACKGROUND OF THE INVENTION

1. Field of the Invention

This invention relates to a light-shielding film, a liquid crystal display device provided with a light-shielding film and a material for forming a light-shielding film.

2. Description of the Related Art

Generally, a liquid crystal display device is provided with a light-shielding film which is also referred to as a black matrix. There has been proposed as a light-shielding film an insulating light-shielding film which is arranged in a matrix form on a region of the display pixel electrode array substrate excluding portions where the display pixel electrode are formed (see Japanese Patent Unexamined Publication S63-64023). This insulating light-shielding film is formed of a polymer compounded and blackened with a black dye or two or more dyes whose colors are complementary to each other.

Since the alignment error between the display pixel electrode array substrate provided with a switching element and the substrate provided with a color filter having a light-shielding film formed on the color filter is generally in the range of 4 to 8 μm, the opening pattern of the black matrix has to be designed by taking into consideration a margin corresponding to the accuracy of alignment.

However, according to this method, since the error of these alignments can be lowered to about ½ or less as compared with the error of the conventional method even with a large substrate of 300 mm×300 mm or more, the lowering of the opening ratio of the black matrix due to the alignment error can be inhibited and the lowering of the off-resistance due to the bypassing of the backlight can be prevented.

As another example of the light-shielding film, a material comprising a photoresist containing a dye or pigment dispersed therein is now actually used. There further have been proposed a light-shielding film serving both as metal wiring in the switching element and as a light-shielding film, or a light-shielding film formed of a metal layer disposed within a passivation layer.

However, if a conductive metal is used as a light-shielding film, it will give rise to problems such as the fluctuation of the potential of the pixel electrode due to the capacity coupling between the pixel electrode and signal lines. In order to avoid these problems, the passivation layer is required to be formed into a two-layer structure, thus making the step of manufacturing the shielding film very complicated.

In view of these problems, there recently has been proposed a shielding film comprising an amorphous carbon thin film (see, Japanese Patent Unexamined Publication H1-244068). According to this light-shielding film, many advantages can be obtained, i.e., it is possible to make the manufacturing step easy and simple, and at the same time to serve the shielding film as a passivation layer.

However, if a light-shielding film is to be formed by using a composition comprising a resist material mixed with a dye or pigment, a thickness of about 2 μm or more is required in order to attain a sufficient light absorption. Employment of such a thick shielding film however gives rise to various problems, including the formation of a high step between the display pixel electrode and the light-shielding portion, thereby causing non-uniformity of electric field to be impressed onto the liquid crystal, and the appearance of alignment defects and reverse tilt or reverse twist in the liquid crystal.

In an attempt to shield the portion of reverse tilt or twist, there has been proposed a method wherein the width of the signal line or scanning line is made larger thereby optically shielding a portion of the display pixel electrode. However, such a method may cause in turn the reduction of the opening ratio of the black matrix. Namely, the purpose of light-shielding film formed on the display pixel electrode array substrate is to increase the opening ratio of the black matrix. However, due to the defects resulting from the increased thickness of the light-shielding film, it is required according to this method to shield the portion of the reverse tilt or twist at the sacrifice of improving the opening ratio.

Further, in the case of a light-shielding film comprising a photoresist containing a dye or pigment dispersed therein, if the concentration of a dye or pigment is increased as much as possible for improving the light-shielding capacity, it will give rise to various problems, e.g., the patterning performance and the alignment accuracy in the process of photolithography would be deteriorated, or the shape of the pattern of the light-shielding film would be badly damaged during scrubbing for removing etching residue during the manufacturing process.

Many of organic materials are generally high in vapor pressure, so that once a film of such an organic material is disposed as an underlayer of the display pixel electrode array substrate, a problem may be brought about in a situation when a high temperature heat treatment is required to be performed in a subsequent process. That is, when a high temperature heat treatment is subsequently performed, the vapor of the organic material would be generated below the substrate, thus deteriorating the morphology of an upper layer.

An amorphous carbon thin film which has been proposed as a light-shielding film for shielding an amorphous silicon thin film transistor (a-Si TFT) is formed of a carbon known as i-carbon which is composed of several kinds of carbons. Specifically, this i-carbon is formed of a mixture of a diamond-like structure and a graphite-like structure. The physical feature of this amorphous carbon thin film is known to fluctuate depending mostly on the film-forming condition. Namely, it has been reported that it is possible to form a film wherein its insulating property is exhibited by the diamond-like portions and its light-shielding property is exhibited by the graphite-like portion. However, since this light-shielding film is highly reflective to light, so that the problem of "mirrored-in" would be presented when it is used for a liquid crystal display device. This phenomenon of "mirrored-in" is caused by the high refractive index of a light-shielding film and solely dependent on the property of a material just like diamond which has a very high refractive index of about 2.5.

Accordingly, it is impossible in the use of this i-carbon film to solve this problem of "mirrored-in" which is inherent to the diamond-like film.

SUMMARY OF THE INVENTION

Therefore, an object of this invention is to provide a thermally stable light-shielding film which is capable of exhibiting such an excellent light-shielding property as comparable to the conventional light-shielding films and inhibiting the phenomenon of "mirrored-in", and at the same time is free from any possibility of badly affecting the alignment property of a liquid crystal.

Another object of this invention is to provide a liquid crystal device comprising a thermally stable light-shielding film which is capable of exhibiting an excellent light-shielding property as comparable to the conventional light-shielding films and inhibiting the phenomenon of "mirrored-in, and at the same time is free from any possibility of badly affecting the alignment property of a liquid crystal.

A further object of this invention is to provide a spattering target material which can be suitably used for the formation of above-mentioned light-shielding film.

Namely, according to the present invention, there is provided a light-shielding film comprising an insulating material film and fine particles of at least one kind selected from the group consisting of metal particles and semi-metal particles, the fine particles being dispersed in the insulating material film.

Further, this invention provides a liquid crystal display device comprising:

a display pixel electrode array substrate including a first substrate, a switching element formed in a matrix pattern on the first substrate and a display pixel electrode connected to the switching element;

a counter substrate disposed to face the display pixel electrode array substrate, and including a second substrate and a counter electrode formed on a surface of the second substrate facing the display pixel electrode array substrate; and a liquid crystal layer interposed between the display pixel electrode array substrate and the counter substrate;

wherein a light-shielding film including an insulating material film, and at least one kind of fine particles selected from the group consisting of metal particles and semi-metal particles which are dispersed in the insulating material film is formed on a surface of the display pixel electrode array substrate.

Additionally, this invention provides a liquid crystal display device comprising:

a display pixel electrode array substrate including a first substrate, a switching element formed in a matrix pattern on the first substrate and a display pixel electrode connected to the switching element;

a counter substrate disposed to face the display pixel electrode array substrate, and including a second substrate and a counter electrode formed on a surface of the second substrate facing the display pixel electrode array substrate; and a liquid crystal layer interposed between the display pixel electrode array substrate and the counter substrate;

wherein at least a portion of an insulating member constituting the liquid crystal device is made of a light-shielding film including an insulating film, and at least one kind of fine particles selected from the group consisting of metal particles and semi-metal particles which are dispersed in the insulating film is formed on a surface of the display pixel electrode array substrate.

Further, this invention provides a sputtering target material for a formation of a light-shielding film containing an insulating material, and at least one kind of element selected from the group consisting of metal and semi-metal, the amount of the at least one kind of element being 5 to 80 at. % based on the insulating material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a plan view schematically illustrating the display pixel portion of a display pixel electrode array substrate;

FIG. 5 is a sectional view schematically showing a liquid crystal display device according to Example 2 of this invention;

FIG. 9 is a plan view schematically illustrating a the display pixel portion of a display pixel electrode array substrate according to Example 6 of this invention;

FIG. 10 is a sectional view illustrating in detail a display pixel electrode array substrate according to Example 6 of this invention;

FIG. 11 is a sectional view illustrating in detail a display pixel electrode array substrate according to Example 7 of this invention;

FIG. 12 is a sectional view illustrating in detail a display pixel electrode array substrate according to Example 9 of this invention;

FIG. 13 is a graph showing the transmission spectrum of the light-shielding film according to Example 9 of this invention;

FIG. 14 is a sectional view schematically showing a liquid display device according to Example 10 of this invention;

FIGS. 15A and 15B are graphs showing the results of investigations as to any incompatibility of the marginal portion of the display region of the liquid crystal device according to Example 10;

FIG. 16 is a perspective view schematically showing the construction of a liquid display device according to Example 11 of this invention; and FIG. 17 is a sectional view illustrating in detail a display pixel electrode array substrate according to Example 11 of this invention.

DETAILED DESCRIPTION OF THE PREFERRED EMBODIMENTS

Figure 1:
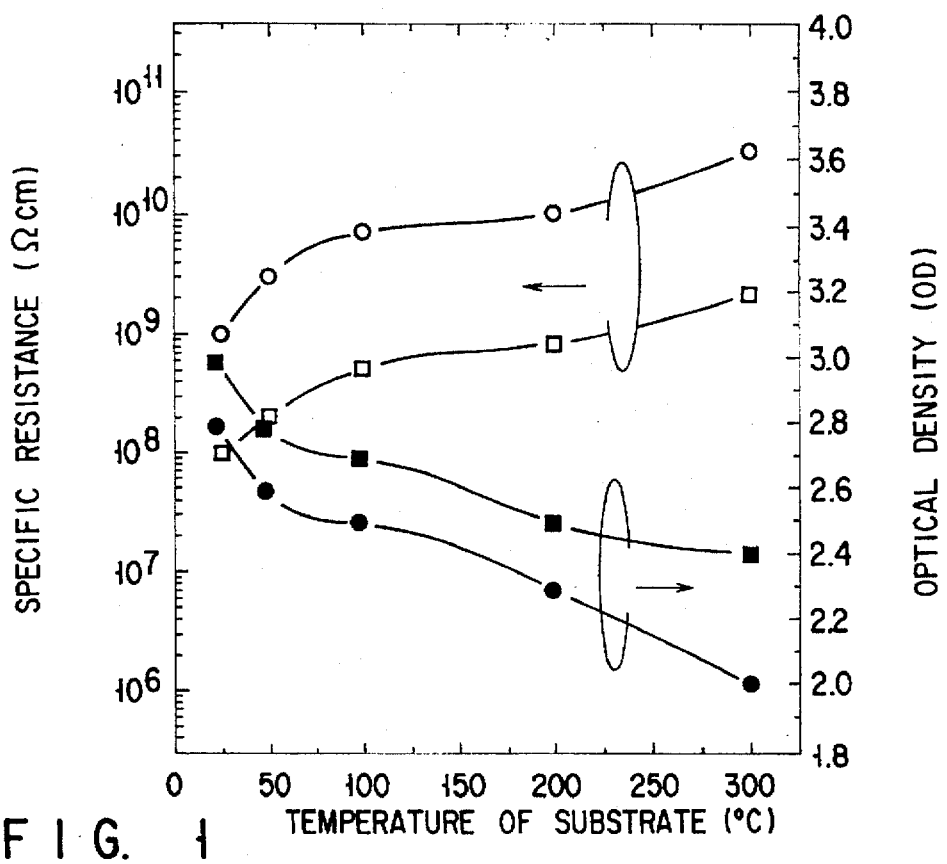
FIG. 1 is a graph illustrating relationships between the optical density and the temperature of a substrate, and between the specific resistance and the temperature of substrate.

This invention will be further explained with reference to preferred embodiments.

The light-shielding film of this invention is characterized in that particles of at least one kind of element selected from metal and semi-metal are dispersed in an insulating material.

The insulating material constituting the light-shielding film may be any kind of material as long as it has a sufficient insulating property to fulfill the requirements demanded for a switching element, for example a thin film transistor to be used in a liquid crystal device. Examples of such insulating material are compounds containing one or more than one element selected from Group IA, Group IIA, Group IIIA, Group IVA and Group VIA of the periodic table. Examples of such a compound are oxides, nitrides, boride, sulfide, chloride, bromide, fluoride, iodide and a combination of two or more of these compounds. These insulating materials may be used in this invention for constituting an insulating substrate.

Specific examples of the insulating materials are silicon nitride ($SiN_x$), aluminum nitride ($AlN_x$), boron nitride ($BN_x$), yttrium oxide ($YO_x$), aluminum oxide ($AlO_x$), magnesium oxide ($MgO_x$), calcium oxide ($CaO_x$), barium oxide ($BaO_x$), strontium oxide ($SrO_x$), silicon oxide ($SiO_x$), gold sulfide ($AuS_x$), gallium oxide ($GaO_x$), lithium fluoride ($LiF_x$), sodium fluoride ($NaF_x$), lithium chloride ($LiCl_x$), lithium bromide ($LiBr_x$), sodium chloride ($NaCl_x$), sodium bromide ($NaBr_x$), potassium fluoride ($KF_x$), rubidium fluoride ($RbF_x$), rubidium chloride ($RbCl_x$), rubidium iodide ($RbI_x$), cesium fluoride ($CsF_x$), cesium chloride ($CsCl_x$), cesium bromide ($CsBr_x$), cesium iodide ($CsI_x$), magnesium fluoride ($MgF_x$), calcium fluoride ($CaF_x$), barium fluoride ($BaF_x$), barium chloride ($BaCl_x$), cadmium fluoride ($CdF_x$) and barium titanate ($BaTi_xO_y$). The atomic ratios (x, y) of these compounds can be suitably selected depending on the conditions for forming the film in various methods.

The band gap of these insulating materials should preferably be 3.8 eV or more in order to deprive these insulating materials of their optical responsibilities. With this band gap, it is possible to cause the photoconduction through an inter-band transition to be substantially vanished.

In order to prevent the reflection of light as much as possible, it is preferable to select an insulating material having a lower refraction index, in particular one having a refraction index of approximately 1. Further, it is preferable to select an insulating material which is less reactive to fine particles of one or more elements selected from metal and semi-metal as mentioned hereinafter, thus avoiding the formation of any compound through a reaction between the insulating material and the fine particles.

As for the fine particles of one or more elements selected from metal and semi-metal to be used in the light-shielding film of this invention, there is no limitation as long as it is capable of blackening the light-shielding film of this invention as they are uniformly dispersed throughout the plane of the insulating light-shielding film. Examples of a preferable element constituting such fine particles for blackening the light-shielding film are metals such as aluminum (Al), cadmium (Cd), cobalt (Co), chromium (Cr), iron (Fe), indium (In), manganese (Mn), nickel (Ni), palladium (Pd), vanadium (V), niobium (Nb) and tantalum (Ta); and semi-metals such as bismuth (Bi) boron (B) and carbon (C).

In the actual use of these fine particles of these elements, they are not confined to ones in the form of a single element, but may be in the form of an alloy of these elements or in the form of a compound of these elements.

Most of the fine particles of these elements are not black, when they are in the state of bulk. However, it is known that if the particle size of these fine particles is not larger than the optical wavelength, they can be turned to black by the plasma resonance absorption. Further, in the case of bismuth, since it is a semi-metal having a small band gap, the band structure thereof can be altered through the quantum size effect thereby contributing to the blackening of Bi fine particles.

In this case, it is required for these fine particles in the insulating material to be sufficiently separated from each other. Specifically, the individual particle are preferably kept apart from each other by a sufficient distance to avoid the superimposition of wave function, e.g., by a distance of about 50 angstroms or more.

In view of these reasons and in order to make the most of the blackening effect by the plasma resonance absorption to fine particles of these elements, it is preferred to select fine particles of these elements which have an average particle diameter of 800 nm or less, more preferably 10 to 600 nm. By the term, "the particle diameter of fine particles" used in this specification, it is intended to mean the diameter of minimum circumference around a particle.

The thickness of the light-shielding film of this invention should preferably be 5 to 300 nm, more preferably 10 to 100 nm.

Preferable examples of combination of the insulating material and the fine particles are found by the present inventors to be $AlN_x$, $SiN_x$ or $BN_x$ with respect to Bi fine particles; $AlN_x$ with respect to Fe fine particles; and $BN_x$ with respect to B fine particles.

The content of the fine particles in the light-shielding film of this invention is preferably 5 to 40 at. %, the balance being an insulating material including generally a trace of unavoidable impurities.

If the content of the fine particles in the insulating material is too low, it would be difficult to obtain a sufficiently blackened light-shielding film. On the other hand, if the content of the fine particles in the insulating material is too high, it would give rise to the lowering of insulating property of the light-shielding film. Therefore, the suitable content of the fine particles is in the range of 5 to 40 at. %, more preferably 15 to 30 at. %.

The optical density (OD) value (the logarithm of inverse of absorptivity coefficient) and specific resistance of the light-shielding film of this invention can be varied depending on the film-forming conditions in various film-forming methods. Thus, it has been found possible through experiments to obtain a light-shielding film 500 nm in film thickness, and having properties of 2.0 or more in optical density (OD) value and $10^9$ Ω·cm or more in specific resistance by controlling these film-forming conditions. Therefore, it is possible to obtain a light-shielding film of excellent properties even with a thin film thickness as compared with the conventional light-shielding film.

According to the light-shielding film of this invention, it is possible through incorporating hydrogen therein to enhance the specific resistance even with the optical density (OD) value (which is substantially determined by the content of the fine particles) being kept at the same level, thereby obtaining an excellent light-shielding film. The preferable content of hydrogen in the light-shielding film is in the range of 5 to 40 at. %, more preferably 25 to 35 at. %.

As method of incorporating hydrogen into a light-shielding film of this invention, hydrogen can be included in advance in an atmosphere during the formation of the light-shielding film, thus making it possible to easily incorporate hydrogen into the light-shielding film. For example, when the content of Bi fine particles is in the range of 5 to 25 at. %, the hydrogen partial pressure in a vacuum chamber is controlled to 10 at. %. Under such conditions, it is possible to obtain a light-shielding film having properties of 2.0 or more in optical density (OD) value and $10^9$ $\Omega \cdot$cm or more in specific resistance even if the substrate is kept at the room temperature.

It is preferable in the light-shielding film of this invention to interpose an oxide material at the interface between the insulating material and the fine particles. This is because if an oxide material is interposed in the interface, it is possible to increase the specific resistance and at the same time to strengthen the bonding between the fine particles and the insulating material constituting a matrix thereby allowing a thermally stable light-shielding film to be obtained. Moreover, since the specific resistance is lowered as the fine particles are directly bonded to each other, the presence of oxides in the interface is also preferable. An example of such an oxide to be interposed in the interface is the oxide of the fine particles constituting the light-shielding film.

The interposition of oxides in the interface between the insulating material and the fine particles may be easily achieved by subjecting a light-shielding film formed by one of various film-forming methods to an oxidizing treatment. This oxidizing treatment can be performed for example by heat-treating a light-shielding film in an oxidizing atmosphere such as the air atmosphere. To be more specific, when the light-shielding film is composed of $SiN_x$ and Bi fine particles, the light-shielding film is kept in the air atmosphere at a temperature of 250° C. for two hours, thereby obtaining a light-shielding film $10^{15}$ $\Omega \cdot$cm in specific resistance and 2.5 in optical density (OD) value with the film thickness thereof being 500 nm. The film thickness of this oxide film may be suitably selected depending on the properties desired of the light-shielding film, but is generally preferred to be in the range of 250 to 600 nm.

It is also preferable that the concentration of the fine particles in the insulating material at one or both surface region(s) of the light-shielding film of this invention be lower than that in the inner region of the light-shielding film. This is because if the concentration of the fine particles in the insulating material at the surface region of the light-shielding film is made lower than that in the inner region of the light-shielding film, it is possible to obtain quite easily a light-shielding film of low light reflection.

With respect to the construction of the light-shielding film of this invention, the light-shielding film of this invention can include only a light-shielding portion of the display device, or the light-shielding film can include both light-shielding portion and a light-nonshielding portion of a display device. In latter case, it is possible to provide a flat structure comprising a light-shielding portion formed flush with a light-nonshielding portion where the light-nonshielding portion is formed with the light-shielding film. If only the light-shielding portion of a display device is to be constituted by the light-shielding film of this invention, the light-nonshielding portion has to be removed through etching after forming a light-shielding film all over the surface of an intended region. In this case, however, a step portion is inevitably formed between the light-shielding portion and the light-nonshielding portion thereby giving rise to the problem of deteriorating the coverage by an upper layer.

This problem may be alleviated by thinning the thickness of the light-shielding film, or by tapering the stepped portion. However, since the magnitude of absorbance is proportional with the thickness of the film, it is generally difficult to achieve a sufficient shielding effect with a thinned light-shielding film. Moreover, the thicker the film is, the greater the tapering required, so that it may become very difficult to make such a tapering.

However, it is possible to solve this problem by adopting a flat structure wherein a light-shielding portion and a light-nonshielding portion are formed as a single layer. The light-shielding film of a flat structure wherein a light-shielding portion and a light-nonshielding portion are formed as a single layer can be easily manufactured by removing, through a selective etching, the fine particles of one or more kinds of elements selected from metal and semi-metal contained in the light-shielding film, or by selectively oxidizing the fine particles of one or more kinds of elements selected from metal and semi-metal contained in the light-shielding film.

The above-mentioned method of removing, through a selective etching, the fine particles of one or more kinds of elements selected from metal and semi-metal contained in the light-shielding film can be performed as follows.

Since the interface between the insulating material and the fine particles is structurally defective in general, it is possible to allow a solvent to be easily impregnated into the light-shielding film. Therefore, the fine particles in the light-shielding film can be selectively etched off by immersing the light-shielding film in a solvent which is capable of selectively dissolving only the fine particles in the light-shielding film but incapable of dissolving the insulating material, thus making it possible to form a decolorized portion of the light-shielding film or a light-nonshielding portion consisting only of the insulating material. Since the molecules of the fine particles are bonded to each other through a metallic bond in contrast to the insulating material whose molecules are bonded to each other through a covalent bond or an ionic bond, the selection of a solvent having such selective solubility would be quite obvious to a person having an ordinary skill.

For example, in the case of a light-shielding film comprising $SiN_x$ and Bi fine particles, a mixed solution comprising HCl, $H_2O_2$ and $NH_4Cl$ may be employed for selectively dissolving only the Bi particles thereby to decolorize the light-shielding film. In this decolorizing process, the portions not to be subjected to the etching should be covered in advance with a film capable of withstanding the etching. This etching process is not restricted to a wet etching using a solution, but may be performed using a gaseous plasma. For example, in the case of Bi fine particles, a $CF_4/O_2/HCl$-based gas may be effectively employed.

The other method of selectively oxidizing the fine particles in a light-shielding film makes use of the expansion of band gap resulting from the selective oxidation of only the light-nonshielding portion of a light-shielding film. Through utilization of this phenomenon, it is possible to decolor the light-shielding film, i.e. to form a light-shielding portion and a light-nonshielding portion. In this decolorizing process, the portions not to be subjected to the oxidation should be covered in advance with a film capable of withstanding the oxidation.

With this flat structure wherein a light-shielding portion and a light-nonshielding portion are formed as a single layer, it is possible to avoid the problem of the formation of a step between a light-shielding portion and a light-nonshielding portion, and to improve the light-shielding property by increasing the film thickness of the light-shielding film.

Moreover, since the light-nonshielding portion is also made of an insulating material according to the light-shielding film obtained in this manner, it is possible to inhibit the phenomenon of "mirrored-in" by using an insulating material having a refractive index of approximately 1, as such an insulating material is capable of lessening the reflectivity.

It is possible according the light-shielding film of this invention to attain various excellent characteristics as explained above by suitably combining constituent features as follows.

(1) A constituent feature wherein fine particles having an average particle diameter of 800 nm or less are dispersed in an insulating material at a concentration of 5 to 40 at. %.

(2) A constituent feature wherein fine particles are dispersed in an insulating material, and hydrogen is incorporated into the light-shielding film.

(3) A constituent feature wherein fine particles are dispersed in an insulating material, and an oxide is interposed at the interface between the insulating material and the fine particles.

(4) A constituent feature wherein fine particles having an average particle diameter of 800 nm or less are dispersed in an insulating material at a concentration of 5 to 40 at. %, and hydrogen is incorporated into the light-shielding film.

(5) A constituent feature wherein fine particles having an average particle diameter of 800 nm or less are dispersed in an insulating material at a concentration of 5 to 40 at. %, and an oxide is interposed at the interface between the insulating material and the fine particles.

(6) A constituent feature wherein fine particles having an average particle diameter of 800 nm or less are dispersed in an insulating material at a concentration of 5 to 40 at. %, hydrogen is incorporated into the light-shielding film, and an oxide is interposed at the interface between the insulating material and the fine particles.

Since the light-shielding film of this invention exhibits insulating properties and is black in color, it can be utilized as a light-shielding film in various kinds of liquid crystal display devices as well as in other devices such as a color cathode ray tube or a color plasma display device where the similar characteristics as mentioned above are demanded.

This invention will be further explained with reference to the following embodiments where the light-shielding film of this invention is employed in a liquid crystal display device.

A liquid crystal display device according to a first embodiment of this invention comprises;

a display pixel electrode array substrate including a first substrate, a switching element formed in a matrix pattern on the first substrate and a display pixel electrode connected to the switching element;

a counter substrate disposed to face the display pixel electrode array substrate, and including a second substrate and a counter electrode formed on a surface of the second substrate facing the display pixel electrode array substrate; and a liquid crystal layer interposed between the display pixel electrode array substrate and the counter substrate;

wherein a light-shielding film including an insulating film, and at least one kind of fine particles selected from the group consisting of metal particles and semi-metal particles which are dispersed in the insulating film is formed on a surface of the display pixel electrode array substrate.

A liquid crystal display device according to a second embodiment of this invention comprises:

a display pixel electrode array substrate including a first substrate, a switching element formed in a matrix pattern on the first substrate and a display pixel electrode connected to the switching element;

a counter substrate disposed to face the display pixel electrode array substrate, and including a second substrate and a counter electrode formed on a surface of the second substrate facing the display pixel electrode array substrate; and a liquid crystal layer interposed between the display pixel electrode array substrate and the counter substrate;

wherein at least a portion of an insulating member constituting the liquid crystal device is made of a light-shielding film including an insulating film, and at least one kind of fine particles selected from the group consisting of metal particles and semi-metal particles which is dispersed in the insulating film is formed on a surface of the display pixel electrode array substrate.

The liquid crystal display device according to this second embodiment may be constructed by combining any of the following constituent features.

(1) A constituent feature wherein the light-shielding film is formed within the first substrate.

(2) A constituent feature wherein a passivation film is further formed on the switching element, and at least a portion of the passivation film constitutes the light-shielding film.

(3) A constituent feature wherein the switching element is a thin film transistor having an etching stopper film over an active layer, and at least a portion of the etching stopper constitutes the light-shielding film.

(4) A constituent feature wherein the switching element is a thin film transistor having a gate electrode, a gate insulating film and an active layer, and at least a portion of the gate insulating film of the thin film transistor constitutes the light-shielding film.

Since the liquid crystal display device having a constituent feature as explained above is provided with a light-shielding film which is thermally stable and capable of inhibiting the phenomenon of "mirrored-in" without badly affecting the light-shielding property of the light-shielding film, i.e., while maintaining the same level of the light-shielding property as compared with the conventional light-shielding film, it is possible to obtain a liquid crystal device which has more excellent features as compared with the conventional liquid crystal device.

Moreover, since at least a portion of the insulating material used as a constituent for a liquid crystal display device can be formed of a light-shielding film comprising an insulating material having fine particles dispersed therein, the structure of the liquid crystal display device can be simplified and at the same time made thinner. This is because the light-shielding film to be used in the liquid crystal display device of this invention can be manufactured to have a relatively high specific resistance depending on the composition, construction and manufacturing conditions.

Moreover, when $SiN_x$ is to be employed for the insulating material constituting a light-shielding film and at the same time when a $SiN_x$ film is to be employed for the passivation film of a liquid crystal display device, they can be formed in a single step without necessitating any additional photolithography or etching step.

According to the above-mentioned liquid crystal display device of this invention, it is possible to improve the blackness of the marginal portion surrounding the display region by forming a light-shielding film at the region external of the display region on the surface of the second substrate.

Namely, it has found by the present inventors that in spite of the fact that when a light-shielding film is formed on a display pixel electrode array substrate, a liquid crystal display device of more excellent performance as compared with the conventional can be certainly obtained, there is still remained a problem that a portion external of the display region is visually felt as being gray in color due to an insufficient light-shielding of the marginal portion of the display region and this tendency becomes more prominent when the display is rather dark.

In the ordinary liquid crystal display device, there is a space left, generally 1 to 3 mm in width, between the outermost circumference of display region and a module frame. The same sort of space is also found between the display region and the verge of opening of a system device such as a personal computer built therein with a liquid crystal display device. The presence of such a space is due to the fact that it is very difficult and expensive to mechanically register the liquid crystal display region with the module frame or the verge of opening of a system device in a precision in the order of μm.

The shielding of light outside the display region is effected by a light-shielding film formed on a display pixel electrode array substrate. This is also true at the region between the pixel electrode and wirings (at the portion of wirings, both of the wirings and black matrix are utilized as a light-shielding film). In the display region, the light-shielding region is formed only with a black matrix 3 to 5 μm in line width, whereas in the region outside the light-shielding region, the light-shielding film is formed with a line width in the order of millimeters. This is why the shielding of light outside the display region is effected by a light-shielding film formed on a display pixel electrode array substrate.

Therefore, in the liquid display device of this invention, a light-shielding film is also formed on at least a portion of region outside the display region on the surface of the second substrate thereby making it possible to shield the light leaked out through the light-shielding film formed on the display pixel electrode array substrate, thereby improving the blackness of the region outside the display region.

Throughout this specification, by the terms of "the region outside the display region", it is intended to mean a region outside the outermost circumference of the display pixel electrode of the display pixel electrode array substrate.

There is no limitation as to the light-shielding film to be formed on the region outside the display region on the surface of the second insulating substrate, i.e. it is possible to increase the blackness of the region outside the display region by employing the light-shielding film of this invention or the light-shielding film of conventional type. The construction of the second insulating substrate provided on the region outside the display region with a light-shielding film may be applied to not only the liquid crystal display device of this invention but also to the conventional liquid crystal display device.

As explained above, the liquid crystal display device of this invention is not confined to one where an a-Si TFT is employed as a switching element, but may include a device where a thin film transistor employing a polysilicon (poly-Si) or CdSe, or a thin film diode of a metal-insulating material-metal (for example, Ta-TaOx-metal) structure (MIM) is employed.

The liquid crystal display device of this invention may include one which is provided with a coordinate input means for designating a desired coordinate point on the display screen of a liquid display device and a driving means for detecting the position of the input means, more specifically a liquid crystal display device wherein a coordinate input means such as an input pen is used, in addition to a key board, to manually describe desired figures, letters on the surface of the display screen, or an information is input through the display screen and the information input through the manually described figures or letters are read and displayed again on the display screen. In this case, the scanning electrodes for detecting the position of the input pen are generally formed in a matrix pattern, and the detection of position of the input pen is performed through an electrostatic bonding between the scanning signals derived from the scanning of the electrodes and the detection electrode mounted on the distal end of the input pen. As a structure for carrying out this input method, there is known a laminated structure comprising a display panel and a pen-input panel (tablet panel). This structure however is accompanied with problems in terms of miniaturization, lightening and cost-saving, so that there is demanded to develop a structure wherein the display panel and pen-input panel can be combined into one panel. As a means for realizing such a structure, there has been developed a liquid crystal display device wherein an active matrix type display is used, and the gate electrode lines and signal electrodes lines formed in a matrix pattern for driving liquid crystal are co-used as a scanning line for detecting the position of the input pen.

In this structure wherein the display panel and the pen-input panel are combined into a common panel, the gate electrode lines for driving liquid crystal are required to be disposed on the side near the operator, raising a problem of lowering the contrast due to the reflection of external light.

Therefore, the light-shielding film according to this invention is interposed between the insulating substrate formed on the surface of a display pixel electrode array substrate for example and the electrodes comprising scanning electrodes and signal electrodes, thereby allowing the scanning electrodes and signal electrodes to be covered with the light-shielding film and preventing the lowering of the contrast due to the reflection of external light on the electrodes.

The light-shielding film according to this invention can be formed by way of a CVD method, a sputtering method, an ion implantation method or the combination of these methods. The CVD method and the sputtering method are suited for forming a film of uniform composition and structure on a substrate of large surface area.

By employing any one of these methods, it is possible to obtain a light-shielding film comprising an insulating material and fine particles of at least one kind selected from metal and semi-metal dispersed in the insulating material. This is because the insulating materials such as $AlN_x$, $SiN_x$ and $BN_x$ are a kind of compound high in covalent bonding so that the surface energy of these compounds differs largely from that of the above-mentioned fine particles, causing the fine particles to be easily aggregated due to the difference in the surface energy thereby obtaining an insulating material containing these fine particles.

The ion implantation method is a method of directly implanting ions constituting the fine particles of at least one kind selected from the group consisting of metal and semi-metal into an insulating substrate such as a glass substrate. It is possible to employ the insulating substrate as a component of a light-shielding film.

According to this method, it is possible to control the distribution in depth wise of the ions by means of ion-pull out voltage for pulling ions out of an ion source, so that the concentration of the fine particles in the surface region of an insulating material can be made lower than that in the inner region of the light-shielding film, thereby allowing a light-shielding film of low reflection to be easily obtained.

The light-shielding film of this invention can be formed by selecting a method as explained above. The materials to be used in this case for forming the light-shielding film may be selected from any materials comprising at least one element selected from the group consisting of metal and semi-metal, and elements constituting the insulating material. For example, if a light-shielding film comprising $SiN_x$ and Bi fine particles is to be formed by means of a sputtering method, a sputtering target comprising Si and Bi is used and the sputtering is performed in an atmosphere containing nitrogen. Further, if hydrogen is to be included in the light-shielding film, the sputtering is performed in an atmosphere containing hydrogen in addition to nitrogen.

It is also possible in this case to employ, for forming a light-shielding film, a material which comprises, as integrally viewed, at least one element selected from metal and semi-metal, the balance being an insulating material and unavoidable impurities.

The composition of a material for forming a light-shielding film can not be definitely determined as the composition of light-shielding film may be varied depending on various conditions at the time of forming the light-shielding film such for example as atmosphere, voltage to be impressed. However, generally a material comprising, as integrally viewed, 5 to 80 at. % of at least one element selected from metals, metalloids and carbon, and the balance of an insulating material including unavoidable impurities may be used for forming a light-shielding film. More preferably, the content of at least one element selected from metals, metalloids and carbon should be 5 to 50 at. %.

The element or elements selected from metal and semi-metal, the insulating material for forming a light-shielding film may be suitably selected depending on the composition of the light-shielding film desired to obtain. For example, as such metal and/or semi-metal, aluminum (Al), boron (B), cadmium (Cd), cobalt (Co), chromium (Cr), iron (Fe), indium (In), manganese (Mn), nickel (Ni), paradium (Pd), vanadium (V), niobium (Nb) and tantalum (Ta) may be employed. On the other hand, as examples of the insulating materials, $AlN_x$, $SiN_x$, $YO_x$, $AlN_x$, $MgO_x$ and $BaTi_xO_y$ may be used.

Next, the features of sputtering target to be employed in a sputtering method as a material for forming a light-shielding film will be explained.

It is possible to adopt various formulas of sputtering target for forming a light-shielding film. For example:

(1) A sputtering target which can be manufactured in accordance with a powder metallurgy method from a mixture of raw materials having a predetermined composition as integrally viewed and comprising at least one element selected from metal and semi-metal, and an insulating material;

(2) A sputtering target which can be manufactured in accordance with a melting method from a mixture of raw materials having a predetermined composition as integrally viewed and comprising at least one element selected from metal and semi-metal, and an insulating material;

(3) A sputtering target which can be manufactured preparing a plurality of target pieces, each of which being composed of at least one element selected from metal and semi-metal, and at least one kind of an insulating material, and arranging these target pieces in position in a complex manner, wherein the surface areas of these target pieces are adjusted so as to obtain a predetermined composition for constituting a light-shielding film;

(4) A sputtering target which can be manufactured from a mixture of raw materials having a predetermined composition as integrally viewed and comprising at least one element selected from metal and semi-metal, and an insulating material, wherein the mixture is coated on a substrate for sputtering target by means of thermal spray process; and (5) A sputtering target which can be manufactured by impregnating a porous sintered body comprising an insulating material with at least one element selected from metal and semi-metal so as to obtain a predetermined composition; may be adopted.

The method of manufacturing a sputtering target through the powder metallurgy method can be conducted as follows. First, powders of at least one element selected from metal and semi-metal, and powders of an insulating material are mixed at a ratio so as to obtain a predetermined composition as integrally viewed, and the mixture is homogenized in a ball mill thereby obtaining a homogenous powder. In this case, if a ball mill wherein the inner wall surface thereof including the surfaces of the balls, or the whole body thereof including the balls are made of one kind or more of the constituent elements of the target is used, the contamination of the sputtering target with impurities can be inhibited.

Subsequently, the homogenous powder thus obtained is filled in a carbon mold, and subjected to a pressure sintering using a vacuum hot press under the conditions of 300° C. or more in heating temperature, and 200 kg/mm² or more in surface pressure thereby obtaining a sintered body. Alternatively, the homogenous powder thus obtained may be filled in a mold, and, after being molded using a wet-CIP, sintered thereby obtaining a sintered body. If it is desired to further densify the sintered body thus obtained from the sintering after the wet-CIP molding, the sintered body may preferably be further subjected to a hot hydrostatic press (HIP).

Subsequently, the sintered body thus obtained is subjected to a mechanical working such as grinding or if required lapping so as to smoothing the surface of the sintered body thereby obtaining a sputtering target of prescribed shape.

Since the characteristics of a light-shielding film to be obtained from the sputtering target is influenced by the composition of the sputtering target thus obtained using this first manufacturing method, it is preferable, in order to form a desired light-shielding film, to suitably select the manufacturing conditions such as particle diameters of each raw powder to be employed, molding condition, sintering condition and working condition in the manufacture of the sputtering target.

The method of manufacturing a sputtering target through the melting method or a second method can be conducted as follows. First, raw material of at least one element selected from metal and semi-metal is caused to melt directly using a suitable melting method such as a electron beam melting, a high frequency melting or a vacuum melting, and the resultant melt is mixed with raw powders of an insulating material in a suitable ratio so as to obtain a predetermined composition as integrally viewed thereby manufacturing an ingot.

Subsequently, the ingot thus obtained is subjected to a mechanical working such as grinding or if required lapping so as to smoothing the surface of the sintered body thereby obtaining a sputtering target of prescribed shape.

It is preferable in view of preventing the generation of dust during the formation of thin film to manufacture the sputtering target in the form of an integral body in the manufacturing method using the first or second method mentioned above. However, a plurality of the same sputtering targets may be used in combination for the purpose of enlarging the sputtering target as a whole. In this case, the joining of plurality of sputtering targets may be effected by means of brazing. In order to prevent the generation of dust from the jointed portion between the sputtering targets, in particular from edge portion of the sputtering target, the joining of plurality of sputtering targets should preferably be effected by a mechanical or physical method such as a diffusion bonding, an electron beam welding or a shrinkage fitting.

The diffusion bonding mentioned above can be performed by any suitable method such as a method of directly joining the targets, a method wherein a material having an excellent wettability to the joining member such as one kind or more of the constituent elements or a third element other than the constituent elements is interposed between the targets, or a method wherein a plated layer having an excellent wettability to the joining member and comprising one kind or more of the constituent elements or a third element other than the constituent elements is interposed between the targets.

The method of manufacturing a sputtering target through the adjustment of the surface areas of a plurality of target pieces or a third method can be conducted as follows. First, ingots are manufactured from a mixture comprising at least one element selected from metal and semi-metal, and an insulating material by way of a powder metallurgy method or a suitable melting method such as a electron beam melting, a high frequency melting or a vacuum melting, and the resultant ingots are mechanically worked if required thereby obtaining a plurality of target pieces from these separate ingots. Thereafter these target pieces are arranged in such a complex manner as to obtain a prescribed composition according to the surface area of each target. Subsequently, the target pieces thus combined are subjected to a mechanical working such as grinding or if required lapping so as to smoothing the surface of the target pieces thereby obtaining a sputtering target of prescribed shape.

Since the characteristics of the light-shielding film to be obtained are influenced by the texture of each target piece and etc., the conditions for manufacturing the target pieces are required to be suitably selected.

Since a plurality of target pieces are arranged in a complex manner in this third method, the joining of joint portion should preferably be effected by a mechanical or physical method such as a diffusion bonding, an electron beam (EB) welding or a shrinkage fitting, in order to prevent the generation of dust from the jointed portion between the sputtering targets, in particular from edge portion of the sputtering target.

The diffusion bonding mentioned above can be performed by any suitable method such as a method of directly joining the targets, a method wherein a material having an excellent wettability to the joining member such as one kind or more of the constituent elements or a third element other than the constituent elements is interposed between the targets, or a method wherein a plated layer having an excellent wettability to the joining member and comprising one kind or more of the constituent elements or a third element other than the constituent elements is interposed between the targets.

The method of manufacturing a sputtering target through the thermal spray process or a fourth method can be conducted as follows. First, a mixture of raw materials having a predetermined composition as integrally viewed and comprising at least one element selected from metal and semi-metal, and an insulating material is subjected to thermal spray process, or the raw materials are individually prepared and the thermal spray process is separately and simultaneously conducted on a sputtering target substrate. Subsequently, the target thus obtained is subjected to a mechanical working such as grinding or if required lapping so as to smoothing the surface of the target thereby obtaining a sputtering target of prescribed shape.

The method of manufacturing a sputtering target through the impregnation or a fifth method can be conducted as follows. First, a porous sintered body is prepared byway of a powder metallurgy method. Thereafter, the porous sintered body is impregnated with at least one element selected from metal and semi-metal so as to obtain a predetermined composition. Subsequently, the target thus obtained is subjected to a mechanical working such as grinding or if required lapping so as to smoothing the surface of the target thereby obtaining a sputtering target of prescribed shape.

The method of impregnation can be performed in the conventional manners, for example by a method of impregnating the sintered body into a melt of at least one kind or more of elements selected from metal and semi-metal, or by a method wherein the sintered body is contacted with at least one kind or more of elements selected from metal and semi-metal and then these metal or semi-metal are heated at the melting temperature thereof or more thereby effecting the impregnation.

With these manufacturing methods, it is possible to obtain a sputtering target useful for the formation of the light-shielding film of this invention.

Throughout this specification, by the terms of "as integrally viewed" used in relative to the material for forming a light-shielding film, it is intended to mean that at least the sputtering portion of the material is in the range of a desired composition.

Since the characteristics of the light-shielding film to be obtained are influenced by the texture of material for forming a light-shielding film, the dispersion texture or the composite texture in the insulating material of at least one element selected from the group consisting of metal and semi-metal as well as the particle diameter and density of the dispersed particles of them may be suitably selected according to the intended characteristics of the light-shielding film.

It is preferable in any of textures mentioned above that at least one element selected from the group consisting of metals, metalloids and carbon may be present in the form of single element or alloy.

In the above explanation on the sputtering target for forming a light-shielding film, only the target comprising at least one element selected from the group consisting of metal and semi-metal, and an insulating material is discussed. However, it is also possible to manufacture a sputtering target comprising at least one element selected from the group consisting of metal and semi-metal in any one of various methods explained above, and to utilize the sputtering target for a reactive sputtering for the manufacture of the light-shielding film of this invention.

This invention will be further explained with reference to the following various examples and to the drawings.

(Example 1)

The relationships between the optical density (OD) and the temperature (°C.) of substrate, and between the specific resistance ($\Omega \cdot cm$) and the temperature (°C.) of substrate in a light-shielding film (a Bi—$SiN_x$ light-shielding film) comprising a $SiN_x$ matrix 500 nm angstroms thick and Bi fine particles dispersed in the matrix, and manufactured by way of a reactive sputtering is shown in FIG. 1; whereas the relationships between the optical density (OD) and the concentration (at. %) of fine particles, and between the specific resistance ($\Omega \cdot cm$) and the concentration (at. %) of fine particles in the same light-shielding film (a Bi—SiN$_x$ light-shielding film) as mentioned above is shown in FIG. 2. The axis of abscissa in each of FIGS. 1 and 2 represents the temperature of substrate and the density of fine particles, and the axis of ordinate in each of FIGS. 1 and 2 represents the specific resistance and the optical density value.

Figure 2:
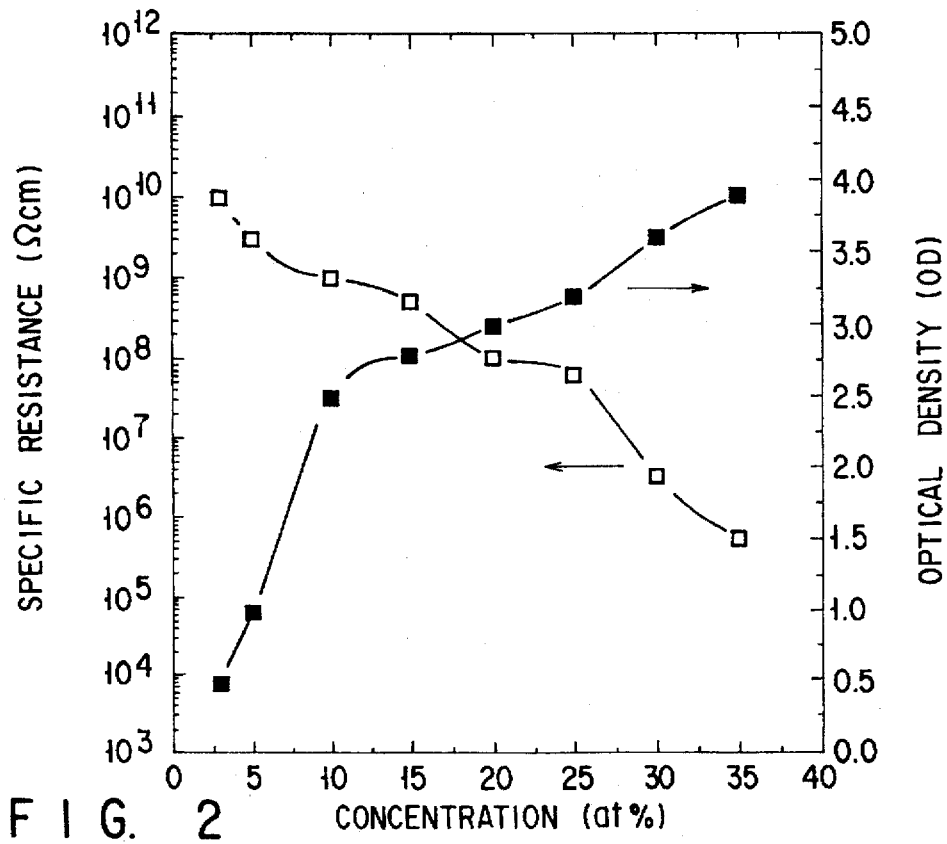
FIG. 2 is a graph illustrating relationships between the optical density and the concentration of fine particles, and between the specific resistance and the concentration of fine particles.

As apparent from FIGS. 1 and 2, in the region where atomic density of Bi is in the range of 10 to 25 at. %, it is possible to obtain a light-shielding film having a specific resistance of $10^9 \Omega \cdot$ cm and an optical density (OD) value of 2.5 by keeping the hydrogen partial pressure in the atmosphere of the vacuum chamber during the sputtering step at the level of 5% even if the temperature of the substrate is maintained at room temperature.

Moreover, when these light-shielding films were kept in an air atmosphere at a temperature of 250° C. for two hours, Bi oxide film was found to have been formed on the surfaces of the Bi fine particles, resulting the formation of a light-shielding film having a specific resistance of $10^{15}$ $\Omega \cdot$cm and an optical density (OD) value of 2.5.

Figure 3:
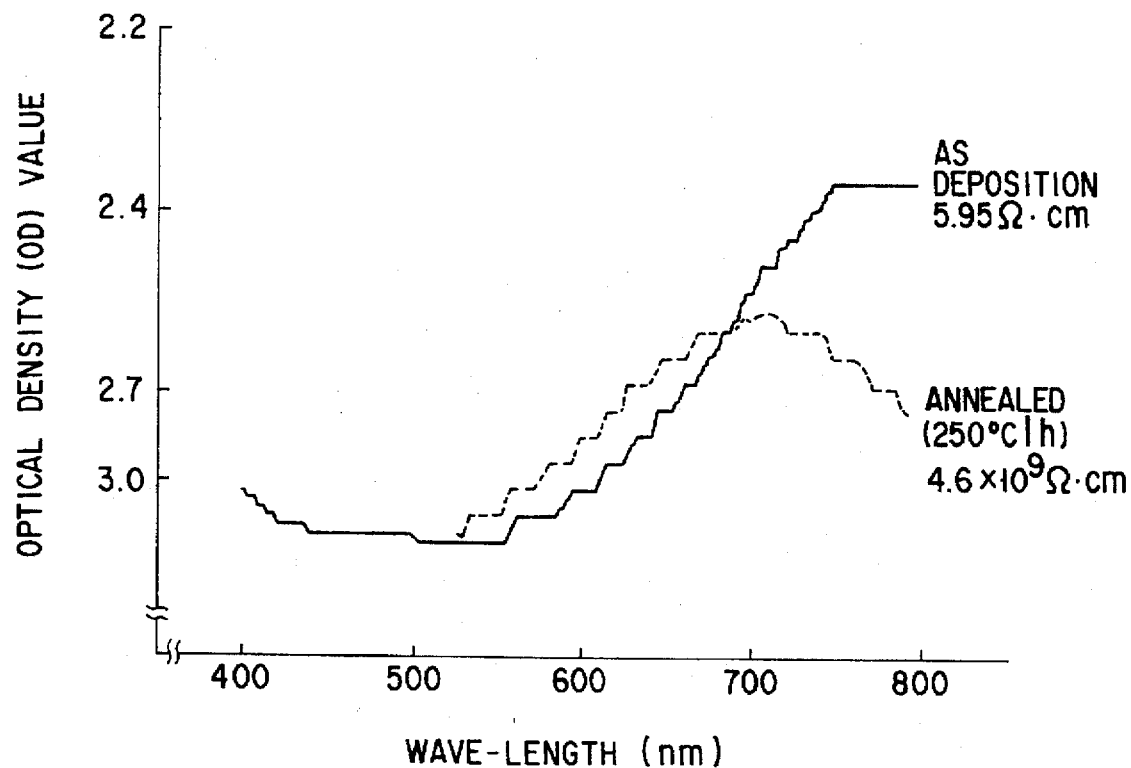
FIG. 3 is a graph illustrating the changes of the specific resistance and the optical density after a thermal treatment.

FIG. 3 shows the relationship between the specific resistance and the transmission spectrum after a thermal treatment (annealing) of the Bi—SiN$_x$ light-shielding film having a thickness of 460 nm which was obtained by a reactive sputtering. The axis of abscissa in FIG. 3 represents the wavelength (nm), and the axis of ordinate in FIG. 3 represents the optical density (OD) value. As apparent from FIG. 3, the specific resistance immediately after the formation of film was as low as 6 $\Omega \cdot$cm, but after the annealing at a temperature of 250° C. for one hour, the specific resistance was increased up to $4.6 \times 10^9$ $\Omega \cdot$cm without substantially fluctuating the OD value. Rather, the light having a wavelength of 700 to 800 nm was made difficult to pass therethrough. Namely, it will be apparent that it is possible as a result of the annealing to increase the specific resistance without substantially affecting the OD value.

Additionally, when these Bi—SiN$_x$ light-shielding films were annealed at a temperature of 350° C. (which is higher than the melting point (270° C.) of Bi) in vacuum (0.1 Pa) for one hour, and observed with a SEM, any change was not recognized in the light-shielding film, indicating that the light-shielding film according to this invention is thermally so stable that the film can be heat-treated at a high temperature even after the formation of light-shielding film.

(Example 2)

As a liquid crystal display device provided with a so-called active matrix type electrode structure, the structure schematically shown in FIGS. 4 and 5 wherein thin film transistors were mounted as a switching element comprising amorphous silicon (a-Si) at each intersection of a matrix wiring was employed. Namely, FIG. 4 shows a plan view schematically illustrating the display pixel portion of a display pixel electrode array substrate and FIG. 5 shows a sectional view schematically showing a liquid crystal display device.

As shown in FIG. 4, a plurality of parallel signal lines 1 and a plurality of scanning lines 2 perpendicularly crossing these signal lines 1 are arranged in a matrix pattern, and a thin film transistor (TFT) is disposed as a switching element at each intersection of the signal lines 1 and the scanning lines 2. The drain electrode of TFT 3 is connected to the signal line 1, and the gate electrode is connected to the scanning line 2. To the source electrode of the TFT 3 is connected a display pixel electrode 4 comprising for example indium-tin oxide (ITO).

The liquid crystal display device provided with electric connections as shown in FIG. 4 is constructed as shown for example in FIG. 5. Namely, in the liquid crystal display device shown in FIG. 5, a display pixel electrode array substrate 5 is disposed to face a counter substrate 6 in parallel with each other, and a liquid crystal layer 7 functioning as an electric/light modulation substance is sandwiched between the display pixel electrode array substrate 5 and the counter substrate 6.

The display pixel electrode array substrate 5 is provided with an insulating substrate 19 made of a glass or plastics. Further, the insulating substrate 19 is provided on its one main surface with signal lines (not shown), scanning lines (not shown), TFT 3 and the display pixel electrode 4. On the other main surface of the insulating substrate 19 is mounted a deflecting plate 20.

On the other hand, the counter substrate 6 is provided with an insulating substrate 22 made of a glass or plastics. Further, this insulating substrate 22 is provided on its one main surface with a color filter 23 comprising red (R), green (G) and blue (B). On this color filter 23 is disposed a counter electrode 24. On the other main surface of the insulating substrate 22 is mounted a deflecting plate 21.

The details of the TFT portion will now be explained as follows.

The reference numeral 8 represents a Bi—SiN$_x$ light-shielding film, below of which is formed a plurality of the same pattern of SiN$_x$ passivation film 9. In FIG. 5, the reference numeral 12 denotes a source electrode, 10 a drain electrode, 11 an etching stopper, 13 a low resistive n$^+$a-Si layer, and 14 an active layer. By the way, the reference numerals 16 and 17 represent respectively a gate insulating layer, and formed into a 2-ply structure comprising for example a SiO$_x$ film 16 and a SiN$_x$ film 17 thereby improving the thinning and dielectric properties of the insulating layer. Further, the reference numeral 15 denotes a gate electrode, 4 an ITO display pixel electrode and 18 a contact electrode.

In the embodiment shown in FIGS. 4 and 5, after forming the passivation film 9 by way of a plasma CVD method, the 25 at. % Bi—SiN$_x$ film 8 having a thickness of 500 nm is formed using a reactive sputtering method. Then, superfluous portions of the Bi—SiN$_x$ film 8 and passivation film 9 such as a portion over the display pixel electrode 4 were etched off using a plasma etching device thereby forming a pattern.

The Bi—SiN$_x$ film 8 can be easily formed using a sputter target comprising a plurality of Bi pieces and Si pieces combined to have a prescribed composition as integrally viewed and arranged in a mosaic pattern, and effecting the DC-sputtering of the target in an atmosphere of a mixed gas comprising Ar/N$_2$/H$_2$ (gas ratio: 2:1:0.1). This sputtering could be performed with the temperature of the substrate being maintained at 50° C. In order to inhibit the reflectivity of the film, the Bi—SiN$_x$ film 8 was kept in an oxidizing atmosphere for 10 minutes at a temperature of 200° C. thereby allowing the surface of the film to be oxidized.

Alternatively, the surface feature of the Bi—SiN$_x$ film 8 can be transformed from a mirror reflection to a diffusion-dominant reflection by controlling the pressure within the film-forming chamber to a relatively high pressure of 0.6 to 0.8 Pa thereby increasing the oblique incidence component of the sputtering particles and lowering the film density. The control of this pressure can be easily achieved by adjusting the flow rate of Ar gas.

According to the structure of this embodiment, it is possible to lower the reflection of light from the light-shielding film as compared with the conventional light-shielding film, and at the same time to make thinner the thickness of the light-shielding film as thin as 500 nm thus making it possible to obtain a reliable liquid crystal display device which is free from liquid crystal alignment defects.
(Example 3)

Figure 6:
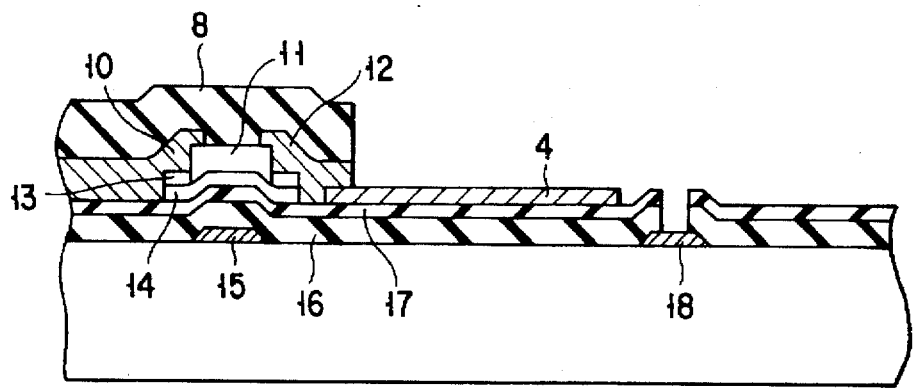
FIG. 6 is a sectional view illustrating in detail a display pixel electrode array substrate according to Example 3 of this invention.

FIG. 6 represents another embodiment according to this invention and shows a sectional view of a display pixel electrode array substrate. Other constituent features are substantially the same as those shown in FIG. 2 so that the same portions as those of FIG. 2 are referred to by the same reference numerals.

The structure of this embodiment is substantially the same as that shown in FIG. 2 except that a passivation film is omitted and the Bi—SiN$_x$ film 8 is substituted therefor and that the thickness of the Bi—SiN$_x$ film 8 is changed to 9,000 angstroms.

The descending speed of ITO potential due to the current drained via the light-shielding film 8 by a capacity coupling from the source electrode 12 is 0.1% or less at 19 ms, and therefore can be disregarded in the actual operation. This leak current can be further lowered, if the concentration of Bi in the light-shielding film 8 is lowered to 15 at. % or less, or if the concentration of hydrogen in the light-shielding film 8 is increased up to about 10%. The specific resistance of this light-shielding film 8 at dark time was found to be $10^{12}$ Ω·cm and any change in value of this specific resistance was not recognized even under an illumination of 3×144 lux.

This invention is not restricted to the structure shown in the above embodiments, but may be a structure of stagger type wherein the light-shielding film is deposited directly over an insulating substrate thereby shielding an a-Si layer. The material of the active layer is not restricted to a-Si, but may be micro-crystalline Si or polycrystalline Si. The light-shielding film of this invention is also applicable to a liquid crystal display device wherein a metal/insulating material/metal (MIM) diode is used as a switching element.
(Example 4)

Figure 7:
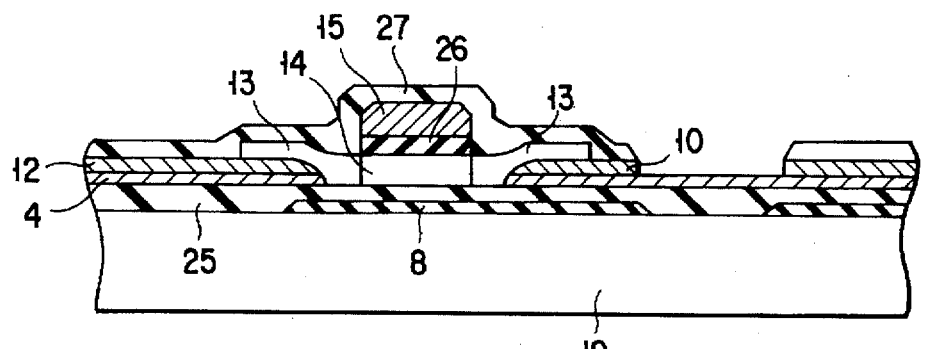
FIG. 7 is a sectional view illustrating in detail a display pixel electrode array substrate according to Example 4 of this invention.

FIG. 7 represents another embodiment according to this invention and illustrates in detail a sectional view of a display pixel electrode array substrate: Other constituent features are substantially the same as those shown in the above embodiment so that the same portions as those of the above embodiment are referred to by the same reference numerals.

On one main surface of an insulating substrate 19 made of glass was deposited a light-shielding film (a Bi—AlN$_x$ light-shielding film) 8 containing Bi fine particles dispersed in its AlN$_x$ layer. This light-shielding film 8 could be obtained by the steps of co-sputtering Bi and Al in a nitrogen atmosphere, and etching the resultant film by means of photo-lithography. This light-shielding film 8 was found to have a thickness of 500 nm, a specific resistance of $10^9$ Ω·cm or more and an OD value of 3. The etching was performed using a plasma etching employing a Cl-based gas such as BCl$_3$/Ar gas or HCl gas.

The upper surface of this light-shielding film 8 was covered with a transparent insulating film 25. As a material for this transparent insulating film 25, a film which is excellent in step coverage can be preferably employed. For example, a SiO$_x$ film which can be formed by means of plasma CVD using a mixed gas comprising TEOS (Tetraethylorthosilicate: Si[OC$_2$H$_5$]$_4$) and O$_2$ may be used. It is also possible to use a cyclic fluorohydrocarbon resin, which is excellent in wettability and can be formed into a very flat transparent film when the film is formed using a spin coating method.

When a SiN$_x$ film is further deposited by means of plasma CVD on the oxide film or nitride film, an excellent interface against the a-Si layer of the channel portion would be attained.

After undergoing these processes, an ITO film and a molybdenum/tungsten (Mo—W) alloy film is deposited and then subjected to an etching treatment by means of photo-lithography thus forming a display pixel electrode 4 and source and drain electrodes 12 and 10 which are formed integral with the display pixel electrode 4.

Subsequently, an active layer 14 0.1 μm thick, a low resistance layer 13 comprising n$^+$poly-Si and a SiN$_x$ film 0.4 μm thick are successively deposited thus covering the source electrode 12 and drain electrode 10. Then, after Al and Mo layers are deposited thereon, an etching is performed by way of photolithography using a resist as a mask thereby forming a gate electrode 15.

Then, the SiN$_x$ film is etched using the same pattern as that of the gate electrode 15 thereby exposing the a-Si at the locations where the gate electrode 15 is not located. After removing the resist, the a-Si layer is doped with phosphorus (P), using the gate electrode 15 as a mask, and irradiated with XeCl eximer laser thereby being crystallized.

Subsequently, the n-type polycrystalline silicon is etched by means of photolithography so as to form the source electrode 10 and drain electrode 12.

Finally, the whole device is covered with a protecting layer 27 comprising for example SiN$_x$, and then portions of the protecting layer 27 located over the pixel portions and the marginal electrode portions are removed.

At this moment, not only the portions of source electrode 10 and drain electrode 12, but also all over the surface of the ITO film constituting the display pixel electrode 4 are covered with an opaque Mo—W film. Therefore, all of the opaque Mo—W film excepting the portions where the source electrode 10 and drain electrode 12 are located is etched off.

As a result of these processes, a liquid crystal display device comprising a glass substrate provided with a light-shielding film comprising an AlN$_x$ layer and Bi fine particles dispersed in the AlN$_x$ layer can be obtained.
(Example 5)

Figure 8:
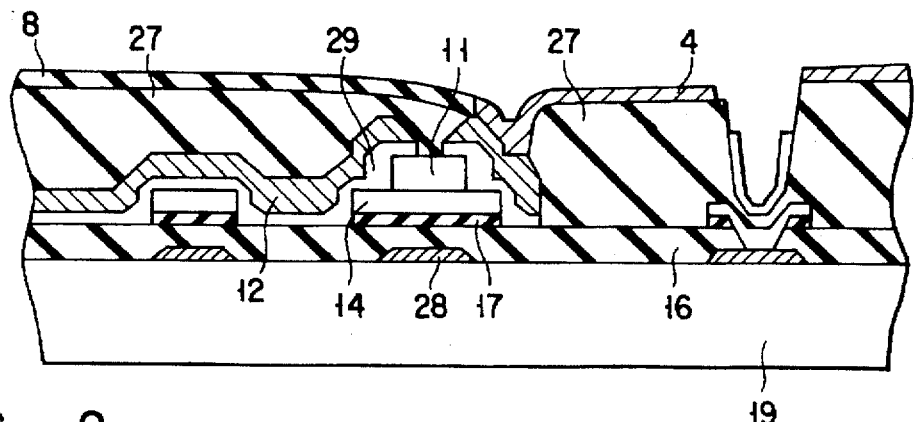
FIG. 8 is a sectional view illustrating in detail a display pixel electrode array substrate according to a Example 5 of this invention.

FIG. 8 represents another embodiment according to this invention and illustrates in detail a sectional view of a display pixel electrode array substrate. Other constituent features are substantially the same as those shown in the above embodiment so that the same portions as those of the above embodiment are referred to by the same reference numerals.

On one main surface of an insulating substrate 19 made of glass was deposited a gate electrode 28 having a thickness of 100 to 300 nm. Subsequently, a gate insulating film 17 having a thickness of 100 nm, a second insulating layer 17 and an active layer comprising a-Si are successively deposited by means of plasma CVD, and then subjected to etching. Further, an etching stopper film 11 is deposited and a patterning is performed. The insulating layer 17 is perforated to prepare pads, and then an n$^+$poly-Si layer and an Al layer 12 constituting a source electrode are successively deposited. After conducting the patterning of these layers, a protective layer 27 is deposited and then patterned. Then, a transparent conductive film 4 comprising ITO is sputter-deposited thereon, and a negative-type resist is coated thereover. Subsequently, an irradiation through the reverse side of the glass insulating substrate 19 is performed with the signal lines and gate electrodes being used as a mask. Another irradiation through the upper surface of the glass insulating substrate 19 is also performed thereby to prepare a display pixel electrode 4 and an auxiliary capacity electrode. Thus, both of the display pixel electrode 4 and auxiliary capacity electrode are formed with the same ITO film.

Further, a light-shielding film (a Bi—SiO$_x$ light-shielding film) 8 containing Bi fine particles dispersed in its AlN$_x$ layer is sputter-deposited thereon up to a thickness of 500 nm. This Bi—SiO$_x$ light-shielding film 8 can be formed by co-sputtering Bi target and SiO$_x$ target in a mixed gas atmosphere of H$_2$/Ar (gas ratio: 1:1).

This Bi—SiO$_x$ light-shielding film 8 is then subjected to an etching treatment by means of photolithography thus removing a portion of the light-shielding film 8 located outside the pixel portions. Etching solution useful in this case is a buffer solution comprising hydrofluoric acid which is adjusted of its pH by adding ammonium fluoride.

(Example 6)

FIGS. 9 and 10 represent another embodiment according to this invention. Specifically, FIG. 9 shows a plan view schematically illustrating a the display pixel portion of a display pixel electrode array substrate of this embodiment; and FIG. 10 shows a sectional view illustrating in detail the display pixel electrode array substrate. Other constituent features are substantially the same as those shown in the above embodiments so that the same portions as those of the above embodiment are referred to by the same reference numerals.

As shown in FIG. 9, a plurality of parallel signal lines 1 and a plurality of scanning lines 2 perpendicularly crossing these signal lines 1 are arranged in a matrix pattern on an insulating substrate made of a transparent glass plate, and a thin film transistor (TFT) 3 is disposed at each intersection of the signal lines 1 and the scanning lines 2. The drain electrode of TFT 3 is connected to the signal line 1, and the gate electrode thereof is connected to each of a display pixel electrode 4, a liquid crystal capacity 30 and an auxiliary capacity 31. In the followings, the method of manufacturing the array substrate constructed in this manner will be explained with reference to FIG. 10.

On the surface of a glass insulating substrate 19 having a SiO$_x$ formed thereon by means of plasma CVD method is deposited through sputtering method a Mo—Ta alloy film having a thickness of 300 nm. Then, the Mo—Ta alloy film is taper-etched using lithography, and a gate electrode 15 as well as an auxiliary capacity electrode (not shown) are formed thereon. Subsequently, four layers, i.e., a SiO$_x$ gate insulating film 16, a SiN$_x$ gate insulating layer 17, an a-Si active layer 14 and a SiN$_x$ etching stopper film are successively deposited by means of plasma CVD. Then, the patterning of the uppermost layer, i.e., a SiN$_x$ etching stopper film 11 is performed, and after a pretreatment, an n$^+$poly-Si layer functioning as a contact for source-drain electrode is deposited by means of plasma CVD.

After conducting the patterning of a-Si layer, a transparent display pixel electrode 4 comprising ITO is sputter-deposited thereon. This electrode 4 is utilized as part of one of the electrodes of the auxiliary capacity. Subsequently, the formation of openings for an address wiring pad, is performed by way of dry etching using a CF$_4$-based etchant. After depositing a 3-ply layer of Mo/Al/Mo thereon by way of sputtering for forming the source and drain electrodes 12 and 10, portions this 3-ply layer and the n$^+$poly-Si layer located over a back channel are selectively removed by means of RIE (reactive ion etching). Then, a SiN$_x$ film to be used as a passivation film 9 is formed by means of plasma CVD method.

Further, a Bi—SiO$_x$ light-shielding film 8 featuring this invention is sputter-deposited thereon up to a thickness of 500 nm. This Bi—SiO$_x$ light-shielding film 8 can be formed by co-sputtering Bi target and SiO$_x$ target in a mixed gas atmosphere of H$_2$/Ar (gas ratio: 1:1).

This Bi—SiO$_x$ light-shielding film 8 is then subjected to an etching treatment by means of photo-lithography thus removing a portion of the light-shielding film 8 located outside the pixel portions. Etching solution useful in this case is a buffer solution comprising hydrofluoric acid which is adjusted of its pH by adding ammonium fluoride.

As result of these processes, a display pixel electrode array substrate for use in a liquid display device can be completed.

By the way, the light-shielding film of this invention is not necessarily required to be disposed on a passivation protecting film, but may be disposed on the gate insulating film, an etching stopper film or an insulating substrate. Namely, the light-shielding film of this invention can be formed on the display pixel electrode array substrate, or on a portion excluding the display pixel portion of the insulating layer that will be used for constituting a liquid crystal display device.

When a liquid crystal display device thus prepared was used to measure the performance of the light-shielding film disposed at a test pattern portion, it was found that the film immediately after the formation thereof (As-Depo) has already indicated an optical density of 2.5 or more and a specific resistance of 10$^9$ Ω·cm or more. Further, when the substrate was annealed at a temperature of 250° C. for 10 minutes, the specific resistance was increased up to 10$^{11}$ Ω·cm or more without causing any substantial fluctuation with respect to the optical density.

As explained above, it is possible to improve the performance of the light-shielding film by subjecting it to annealing. By the way, when hydrogen was introduced into a gas atmosphere at the concentration of 10% at the occasion of sputtering step for the formation of the film, the resultant film immediately after the formation thereof indicated a specific resistance of 1.2×10$^{11}$ Ω·cm, demonstrating that it is possible to obtain a light-shielding film having a sufficiently excellent properties to withstand the actual use.

(Example 7)

FIG. 11 represents another embodiment according to this invention and illustrates in detail a sectional view of a display pixel electrode array substrate. Other constituent features are substantially the same as those shown in the above embodiments so that the same portions as those of the above embodiment are referred to by the same reference numerals.

The manufacturing method of a light-shielding film according to this embodiment is based on the utilization of ion implantation, i.e., Bi$^{2+}$ ion is employed to implant Bi into a glass insulating substrate by means of ion implantation method, and the resultant substrate is subsequently heat treated to diffuse the Bi in the substrate.

First, on the surface of a glass insulating substrate 19 is deposited through sputtering method a Mo—Ta alloy film which is then selectively etched using lithography, leaving the portions which correspond to the pixel portions. Then, Bi$^{2+}$ ion is ion-implanted in the film. The conditions for this ion implantation are about 10$^{-7}$ Torr. in vacuum pressure, about 320 keV in ion-pull out voltage and about 10$^{17}$ ions/cm$^2$ in dosage.

In this case, since the glass insulating substrate 19 is of insulating properties, it is preferable, in order to make it conductive, to deposit in advance about 50 angstroms of a Bi layer on the surface of the substrate 19 by means of sputtering. Subsequently, Bi, oxide thereof and Mo—Ta alloy film remaining on the surface of the glass insulating substrate is totally etched off by using CF$_4$ +O$_2$ gas. Thereafter, the substrate is subjected to annealing by irradiating it with 200 pulse of 5 eV KrF eximer laser. This irradiation may be performed with a power of 150 J/cm², a frequency of 10 Hz and a pulse width of 20 ns.

In this way, a pattern of light-shielding film 8 which corresponds to portions other than the pixel portions in the glass insulating substrate 19 can be formed inside the glass insulating substrate 19.

Subsequent manufacturing processes can be performed in the same manner as explained in Example 6.

The light-shielding film thus obtained is featured in that since the light-shielding film is buried in the glass insulating substrate, the refractive index on the surface of the glass is kept remained at the same level before the ion implantation, the phenomenon of mirrored-in can be controlled to minimum, the generation of unevenness due to the pattern of the light-shielding film can be avoided (i.e. flatness is maintained), the problem of deteriorating the coverage of films to be subsequently deposited due to thick under-layer of light-shielding film can be avoided, and as a result, the reliability of a liquid display device can be improved.

(Example 8)

This example illustrates another embodiment, an featured in that the light-shielding film of this invention is formed by a film-forming method comprising a combination of MOCVD and PECVD.

The same processes as described in Example 6 are repeated up to the step of forming a passivation layer, and a Bi—SiN$_x$ light-shielding film functioning also as a passivation is manufactured as follows.

Vapor of Bi(NO$_3$)$_3$H$_2$O solution is supplied as a source gas of Bi, and a gas mixture comprising SiH$_4$, NH$_3$, N$_2$, H$_2$ in the ratio of 1:5:30:1 is supplied as a source gas of SiN$_x$. As carrier gas for feeding the source gas of Bi, Ar gas is employed. The glass insulating substrate is heated to a temperature of 300° C., and the film-forming is conducted under the conditions of 1.4 kW in RF power, 3.5 Pa in pressure, 10 minutes in deposition period of time, thereby obtaining a nearly 450 nm-thick light-shielding film.

(Example 9)

FIG. 12 represents another embodiment according to this invention and illustrates in detail a sectional view of a display pixel electrode array substrate. Other constituent features are substantially the same as those shown in the above embodiments so that the same portions as those of the above embodiment are referred to by the same reference numerals.

On one main surface of an insulating substrate 19 made of glass was deposited a Bi—AlN$_x$ light-shielding film 8 containing 25 at. % of Bi fine particles dispersed in its SiN$_x$ layer up to a thickness of about 5,000 angstroms, using a reactive sputtering method. The portions not to be decolorized are covered with a photoresist, and then the substrate 19 is immersed into a mixed solution of 37% HCl:36% H$_2$O$_2$.5 mol NH$_4$Cl=5:1:1 for about two minutes, thereby dissolving and removing only Bi fine particles from the SiN$_x$ layer. As a result, decolorization of light-nonshielding portion 8' is effected thereby forming a flat light-shielding film 8. The transmission spectrum of the light-shielding film thus obtained is shown in FIG. 13.

As apparent from FIG. 13, the transmittance of the light-nonshielding portion was found to be almost 100%, indicating a satisfactory performance. In this FIG. 13, the axis of abscissa represents wavelength (nm), and the axis of ordinate represents transmittance (%).

A SiN$_x$ insulating film 25, an ITO film and a Mo—W alloy film are successively formed on the light-shielding film 8, and then the ITO film and Mo—W alloy film are selectively etched using photolithography, thereby forming a source electrode 12 and a drain electrode 10, each being formed integral with the display pixel electrode 4. Subsequently, an a-Si active layer 14, an n$^+$ poly-Si low resistance layer 13, a SiN$_x$ film and an Al—Mo film are successively formed, and then the SiN$_x$ film and Al—Mo film are selectively etched using photolithography, thereby forming a gate electrode 15 and a gate insulating film 26 respectively. Then, a portion of the a-Si layer where the gate electrode is not located is doped with phosphorus and then irradiated by XeCl exima laser thereby crystallizing that portion. The n-type polysilicon layer thus obtained is selectively etched by means of photolithography thereby forming a source region and a drain region. Subsequently, a protecting film 27 comprising SiN$_x$ is deposited all over the substrate, and then the SiN$_x$ films over the pixel portion and the peripheral portion of electrode are removed using photolithography, and finally the Mo—W film over the ITO is removed.

As a result of these steps, a display pixel electrode array substrate provided with a light-shielding film of this invention was prepared, thereby manufacturing a liquid crystal device.

Since a light-shielding portion and a light-nonshielding portion can be made into a flat single-layered structure according to this invention, it is possible to avoid the problem of generating a step portion between the light-shielding portion and the light-nonshielding portion. Moreover, since the light-shielding portion as well as the light-nonshielding portion are of insulating properties, it is possible to weaken the reflectivity and at the same time to inhibit the phenomenon of mirrored-in by using an insulating material having refractive index of approximately 1.

(Example 10)

FIG. 14 represents another embodiment according to this invention and illustrates schematically a sectional view of a liquid crystal display device. The display pixel electrode array substrate employed in this embodiment is structurally the same as that (FIG. 2) used in Example 2.

The light-shielding film 8 disposed on the display pixel electrode array substrate 5 are formed at the peripheral portion of the display region in a larger width of 3 mm as shown in FIG. 14. Additionally, a color filter 23 is formed on the insulating substrate 22 of the counter substrate 6 in such a manner as to face the display pixel electrode 4 of the insulating substrate 19 of the display pixel electrode array substrate. Furthermore, a coat layer 33 consisting of acryl resin is formed over the color filter 23 and the light-shielding film 32, and an ITO film is formed as a counter electrode 24. Although not shown in this Figure, an alignment film is formed over the display pixel electrode array substrate 5 and the counter substrate 6, and a liquid crystal composition is interposed between these substrates.

In addition to the liquid crystal display device of this example, another liquid crystal display device comprising a counter substrate not provided with a light-shielding film is prepared as a comparative example. Using these display devices, a text representation was displayed while changing the background color, and feelings by 100 panel members were examined as to if they feel any incongruity against the marginal portion of the display region. The results are shown in FIGS. 15A and 15B. In these drawings, the axis of ordinate represents abnormality recognition rate (%) the axis of abscissa represents the fluctuation level of brightness of background black level. Specifically, FIG. 15A shows the results obtained from the use of the liquid crystal display device of this Example, and FIG. 15B shows the results obtained from the use of the liquid crystal display device whose counter substrate is not provided with a light-shielding film.

As apparent from FIGS. 15A and 15B, there was no one who felt any incongruity regardless of the fluctuation of brightness in the case of the liquid crystal display device of this embodiment. Whereas, in the case of the liquid crystal display device whose counter substrate is not provided with a light-shielding film, one who felt an incongruity was increased as the background color became increasingly darkened.

According to the liquid crystal display device of this embodiment, it is possible to increase the blackness of the marginal portion of the display region of a liquid crystal display device.

(Example 11)

FIGS. 16 and 17 represent another embodiment according to this invention. In these drawings, the same as those shown in the above embodiments are referred to by the same reference numerals.

Specifically, FIG. 16 shows a perspective view schematically showing the construction of a liquid display device which is capable of reading the coordinate of figures or letters which have been manually described using a coordinate input means such as an input pen and displaying them on a display panel. FIG. 17 shows a sectional view illustrating in detail a display pixel electrode array substrate.

In FIG. 16, the reference numeral 34 denotes an input pen, 35 an amplifier and 36 a detection electrode. Further, the reference numeral 37 denotes a protecting plate for protecting the liquid crystal display device, 2 scanning lines and 1 signal lines. The detection of position of the input pen 34 is performed through an electrostatic coupling between the scanning lines 2 or the signal lines 1 and the detection electrode 36 mounted on the distal end of the input pen 34. Furthermore, the reference numeral 20 denotes a deflection plate, 19 an insulating substrate, 3 a TFT and 4 a display pixel electrode, thus constituting a display pixel electrode array substrate. On the other hand, the reference numeral 24 denotes a counter electrode, 23 a color filter, 22 an insulating substrate and 21 a deflection plate, thus constituting a counter substrate.

Next, there will be explained about the display pixel portion of the display pixel electrode array substrate shown in FIG. 17.

Namely, the reference numeral 8 denotes a light-shielding film according to this invention, which has been prepared by first co-sputtering $SiN_x$ and Bi on one main surface of an insulating substrate made of glass thereby depositing a Bi—$SiN_x$ light-shielding film which is then subjected to an etching processing. Herein, the reference numeral 2 denotes a gate electrode, 16 and 17 a gate insulating film respectively, 14 an active layer made of an a-Si, 11 an etching stopper film, 29 an $n^+$a-Si low resistance layer, 12 a source electrode and 10 a drain electrode connected to the signal lines. Further, the reference numeral 4 denotes a pixel electrode made of ITO, 9 a passivation film made of $SiN_x$, 18 a contact electrode and 27 a protecting film. Although not shown in this Figure, an alignment film is disposed over the passivation film 9. With this display pixel electrode array substrate constructed as explained above, a liquid crystal display device as shown in FIG. 16 has been prepared.

According to this liquid crystal display device as constructed above, it is possible to cover the scanning electrodes as well as the signal electrodes with a light-shielding film, thereby preventing the lowering of contrast resulting from the reflection of the external light from the electrodes.

(Example 12)

This example relates to a sputtering target for forming a light-shielding film. Namely, a sputtering target for forming a light-shielding film of this invention has been prepared as explained below.

First, Bi particles 1 to 2 μm in average particle diameter and Si3N4 particles 10 to 20 μm in average particle diameter are mixed together in the predetermined weight ratio, and the mixture was homogenized in a ball mill for 30 minutes thereby obtaining a homogeneous particle mixture. This mixture was then charged into a carbon mold, and subjected to hot press under the conditions of 250 kg/cm$^2$ in surface pressure and 600° C., thereby obtaining a sintered body comprising Bi and $SiN_x$. The sintered body thus obtained was further subjected to a cutting work and a grinding work, thereby obtaining a Bi—$SiN_x$ sputtering target 127 mm in diameter and 5 mm in thickness for a light-shielding film.

The sputtering target thus obtained was bonded to a packing plate made of oxygen free copper using a solder, and then mounted on a sputtering apparatus to prepare the light-shielding films and liquid crystal display devices constructed as explained in the above Examples 1 to 11.

As explained above, it is possible according to this invention to inhibit the phenomenon of mirrored-in without deteriorating the light-shielding property of a light-shielding film (or while keeping the same level of light-shielding property as that of the conventional light-shielding film), to obtain a thermally stable light-shielding film without deteriorating the liquid crystal alignment property, to obtain a liquid crystal display device provided with such an excellent light-shielding film, and to obtain a row material for forming such an excellent light-shielding film.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-shielding film comprising:
   an insulating film formed from at least an inorganic insulating material; and
   fine particles dispersed in and throughout at least a substantial portion said inorganic insulating film, said fine particles being at least one member selected from the group consisting of a metal and semi-metal.

2. The light-shielding film according to claim 1, wherein said inorganic insulating material is a compound containing at least one element selected from the group consisting of Group 1A, Group IIA, Group IIIA, Group IVA and Group VIA elements of the periodic table.

3. The light-shielding film according to claim 1, wherein said metal is at least one member selected from the group consisting of aluminum, cadmium, cobalt, chromium, iron, indium, manganese, nickel, palladium, niobium, tantalum, vanadium and an alloy of any of these metals, and wherein said semi-metal is at least one member selected from the group consisting of bismuth, boron and carbon.

4. The light-shielding film according to claim 1, wherein said inorganic insulating material is selected from the group consisting of aluminum nitride, silicon nitride, and boron nitride, and further wherein said fine particles are formed of bismuth.

5. The light-shielding film according to claim 1, wherein said inorganic insulating material is aluminum nitride, and further wherein said fine particles are formed of iron.

6. The light-shielding film according to claim 1, wherein said inorganic insulating material is boron nitride, and further wherein said fine particles are formed of boron.

7. The light-shielding film according to claim 1, wherein said inorganic insulating material has a band gap of 3.8 eV or more.

8. The light-shielding film according to claim 1, wherein said fine particles have an average particle diameter of 800 nm or less.

9. The light-shielding film according to claim 1, wherein a concentration of said fine particles in said inorganic insulating film is 5 to 40 at. %.

10. The light-shielding film according to claim 1, wherein said light-shielding film has an optical density of 2.0 or more, and specific resistance of $10^9$ $\Omega$·cm or more.

11. The light-shielding film according to claim 1, wherein a concentration of said fine particles in a surface region of said inorganic insulating film is lower than a concentration of said fine particles in an inner region of said inorganic insulating film.

12. The light-shielding film according to claim 1, wherein said light-shielding film has a light-shielding portion and a light-nonshielding portion.

13. The light-shielding film according to claim 12, wherein said light-nonshielding portion is a modified portion of said light-shielding film.

14. The light-shielding film according to claim 13, wherein said modified portion is a selectively etched portion of said light-shielding film having said fine particles removed therefrom.

15. The light-shielding film according to claim 14, wherein said modified portion is prepared by selectively etching and removing said particles with a gas plasma using at least one gas selected from the group consisting of $CF_4$, $O_2$ and HCl.

16. The light-shielding film according to claim 13, wherein said fine particles contained in said light-nonshielding portion are oxidized fine particles.

17. The light-shielding film according to claim 1, wherein said fine particles have an average particle diameter of 800 nm or less, and a concentration of said fine particles in said inorganic insulating film is 5 to 40 at. %.

18. The light-shielding film according to claim 1, wherein said film further comprises hydrogen.

19. The light-shielding film according to claim 1, wherein an oxide is interposed at an interface between said inorganic insulating material film and said fine particles.

20. The light-shielding film according to claim 1, wherein said fine particles have an average particle diameter of 800 nm or less, a concentration of said fine particles in said inorganic insulating film is 5 to 40 at. %, and said film further comprises hydrogen.

21. The light-shielding film according to claim 1, wherein said fine particles have an average particle diameter of 800 nm or less, a concentration of said fine particles in said inorganic insulating film is 5 to 40 at. %, and an oxide is interposed at an interface between said inorganic insulating material film and said fine particles.

22. The light-shielding film according to claim 1, wherein said fine particles have an average particle diameter of 800 nm or less, a concentration of said fine particles in said inorganic insulating film is 5 to 40 at. %, said film further comprises hydrogen, and an oxide is interposed at an interface between said inorganic insulating material film and said fine particles.

23. A liquid crystal display device comprising:
    a display pixel electrode array substrate including a first substrate, a switching element formed in a matrix pattern on the first substrate, and a display pixel electrode connected to the switching element;
    a counter substrate disposed to face the display pixel electrode array substrate, and including a second substrate and a counter electrode formed on a surface of the second substrate facing the display pixel electrode array substrate;
    a liquid crystal layer interposed between the display pixel electrode array substrate and the counter substrate; and
    a light-shielding film formed on a surface of said display pixel electrode array substrate, said light-shielding film including an inorganic insulating film formed from at least an insulating material and fine particles dispersed in and throughout at least a substantial portion of said inorganic insulating film, said fine particles being at least one member selected from the group consisting of metal particles and semi-metal particles.

24. The liquid crystal display device according to claim 23, wherein said inorganic insulating material is a compound containing at least one element selected from the group consisting of Group 1A, Group IIA, Group IIIA, Group IVA and Group VIA elements of the periodic table.

25. The liquid crystal display device according to claim 23, wherein said metal is at least one member selected from the group consisting of aluminum, cadmium, cobalt, chromium, iron, indium, manganese, nickel, palladium, niobium, tantalum, vanadium and an alloy of any of these metals, and wherein said semi-metal is at least one member selected from the group consisting of bismuth, boron and carbon.

26. The liquid crystal display device according to claim 23, wherein said inorganic insulating material is selected from the group consisting of aluminum nitride, silicon nitride, and boron nitride, and further wherein said fine particles are formed of bismuth.

27. The liquid crystal display device according to claim 23, wherein said inorganic insulating material is aluminum nitride, and said fine particles are formed of iron.

28. The liquid crystal display device according to claim 23, wherein said inorganic insulating material is boron nitride, and said fine particles are formed of boron.

29. The liquid crystal display device according to claim 23, wherein said inorganic insulating material has a band gap of 3.8 eV or more.

30. The liquid crystal display device according to claim 23, wherein said fine particles have an average particle diameter of 800 nm or less.

31. The liquid crystal display device according to claim 23, wherein a concentration of said fine particles in said inorganic insulating film is 5 to 40 at. %.

32. The liquid crystal display device according to claim 23, wherein said light-shielding film has an optical density of 2.0 or more, and specific resistance of $10^9$ $\Omega$·cm or more.

33. The liquid crystal display device according to claim 23, wherein a concentration of said fine particles in a surface region of said inorganic insulating film is lower than a concentration of said fine particles in an inner region of said inorganic insulating film.

34. The liquid crystal display device according to claim 23, wherein said light-shielding film has a light-shielding portion and a light-nonshielding portion.

35. The liquid crystal display device according to claim 34, wherein said light-nonshielding portion is a modified portion of said light-shielding film.

36. The liquid crystal display device according to claim 35, wherein said modified portion is a selectively etched portion of said light-shielding film having said fine particles removed therefrom.

37. The liquid crystal display device according to claim 36, wherein said modified portion is prepared by selectively etching and removing said particles with a gas plasma using at least one gas selected from the group consisting of $CF_4$, $O_2$ and HCl.

38. The liquid crystal display device according to claim 36, wherein said fine particles contained in said light-nonshielding portion are oxidized fine particles.

39. The liquid crystal display device according to claim 23, wherein said fine particles have an average particle diameter of 800 nm or less, and a concentration of said fine particles in said inorganic insulating film is 5 to 40 at. %.

40. The liquid crystal display device according to claim 23, wherein said film further comprises hydrogen.

41. The liquid crystal display device according to claim 23, wherein an oxide is interposed at an interface between said inorganic insulating material film and said fine particles.

42. The liquid crystal display device according to claim 23, wherein said fine particles have an average particle diameter of 800 nm or less, a concentration of said fine particles in said inorganic insulating film is 5 to 40 at. %, and said film further comprises hydrogen.

43. The liquid crystal display device according to claim 23, wherein said fine particles have an average particle diameter of 800 nm or less, a concentration of said fine particles in said inorganic insulating film is 5 to 40 at. %, and an oxide is interposed at an interface between said inorganic insulating material film and said fine particles.

44. The liquid crystal display device according to claim 23, wherein said fine particles have an average particle diameter of 800 nm or less, a concentration of said fine particles in said inorganic insulating film is 5 to 40 at. %, said film further comprises hydrogen, and an oxide is interposed at an interface between said inorganic insulating material film and said fine particles.

45. The liquid crystal display device according to claim 23, which further comprises a coordinate input means for designating a desired coordinate point on a display screen of said liquid display device and a driving means for detecting the position of said input means.

46. A liquid crystal display device comprising:
a display pixel electrode array substrate including a first substrate, a switching element formed in a matrix pattern on the first substrate, and a display pixel electrode connected to the switching element;
a counter substrate disposed to face the display pixel electrode array substrate, and comprising a second substrate and a counter electrode formed on a surface of the second substrate facing the display pixel electrode array substrate;
a liquid crystal layer interposed between the display pixel electrode array substrate and the counter substrate; and
an insulating member at least a portion of said insulating member being a light-shielding film, said light-shielding film being formed on a surface of said display pixel electrode array substrate and comprising an inorganic insulating film formed from at least an insulating material and fine particles dispersed in and throughout at least a substantial portion of said inorganic insulating film said fine particles being at least one member selected from the group consisting of metal particles and semi-metal particles.

47. The liquid crystal display device according to claim 46, wherein said light-shielding film is formed inside said first substrate.

48. The liquid crystal display device according to claim 46, wherein said switching element is further provided thereon with a passivation film, at least part of which is formed of said light-shielding film.

49. The liquid crystal display device according to claim 46, wherein said switching element is a thin film transistor comprising an active layer provided thereon with an etching stopper film, at least part of which is formed of said light-shielding film.

50. The liquid crystal display device according to claim 46, wherein said switching element is a thin film transistor comprising a gate electrode, a gate insulating film and an active layer, at least part of said gate insulating film of said thin film transistor is formed of said light-shielding film.

51. The liquid crystal display device according to claim 46, wherein said second substrate is provided at a marginal portion outside a display region thereof with said light-shielding film.

52. The liquid crystal display device according to claim 46, which further comprises a coordinate input means for designating a desired coordinate point on a display screen of said liquid display device and a driving means for detecting the position of said input means.

53. A sputtering target material for a formation of a light-shielding film, which contains an inorganic insulating material and at least one kind of element selected from the group consisting of metal and semi-metal dispersed in and throughout at least a substantial portion of said inorganic insulating material, the sputtering target material having a concentration of said at least one kind of element in a range of from 5 to 80 at. %.

54. The sputtering target material according to claim 53, wherein said inorganic insulating material and said element are arranged in a mosaic pattern.

55. The sputtering target material according to claim 53, wherein said inorganic insulating material and said element are mixed together.

* * * * *